(12) United States Patent　(10) Patent No.: US 11,205,030 B2
Doi　(45) Date of Patent: Dec. 21, 2021

(54) AVOIDING DATA EXCHANGE IN GATE OPERATION FOR QUANTUM COMPUTING GATES ON A CHIP

(71) Applicant: INTERNATIONAL BUSINESS MACHINES CORPORATION, Armonk, NY (US)

(72) Inventor: Jun Doi, Yokohama (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 429 days.

(21) Appl. No.: 16/238,935

(22) Filed: Jan. 3, 2019

(65) Prior Publication Data

US 2020/0218787 A1　Jul. 9, 2020

(51) Int. Cl.
*G06N 10/00*　(2019.01)
*G06F 30/33*　(2020.01)

(52) U.S. Cl.
CPC ............. *G06F 30/33* (2020.01); *G06N 10/00* (2019.01)

(58) Field of Classification Search
CPC .................................................. G06N 10/00
See application file for complete search history.

(56) References Cited

U.S. PATENT DOCUMENTS

| 2016/0125311 A1 | 5/2016 | Fuechsle et al. |
| 2018/0114138 A1 | 4/2018 | Monroe et al. |
| 2021/0103692 A1* | 4/2021 | Allouche ................ G06F 30/33 |

OTHER PUBLICATIONS

Fischer, J.E., "A parallel quantum computer simulator" Calhoun Thesis and Dissertation (Sep. 2016) pp. 1-130.
Garcia, H.J. et al., "Simulation of Quantum Circuits via Stabilizer Frames" arXiv: 1712.03554v1 (Dec. 2017) pp. 1-15.

* cited by examiner

*Primary Examiner* — Matthew L Reames
(74) *Attorney, Agent, or Firm* — Tutunjian & Bitetto, P.C.; Randall Bluestone

(57) ABSTRACT

A computer-implemented method performed by one or more computing nodes for simulating a gate operation of quantum computing is disclosed. In the method, a problem having $2^n$ size is divided into a plurality of sub-problems, each of which has $2^m$ size. A first index table for storing a first identifier is prepared for each sub-problem. In response to a request for a gate operation involving exchanges of quantum amplitudes that are designated by a target qubit at least in part, a determination is made as to whether a first condition regarding at least the target qubit and m is satisfied or not. In response to the first condition being satisfied, corresponding first identifiers in the first index table are swapped in place of the exchanges of the quantum amplitudes.

19 Claims, 16 Drawing Sheets

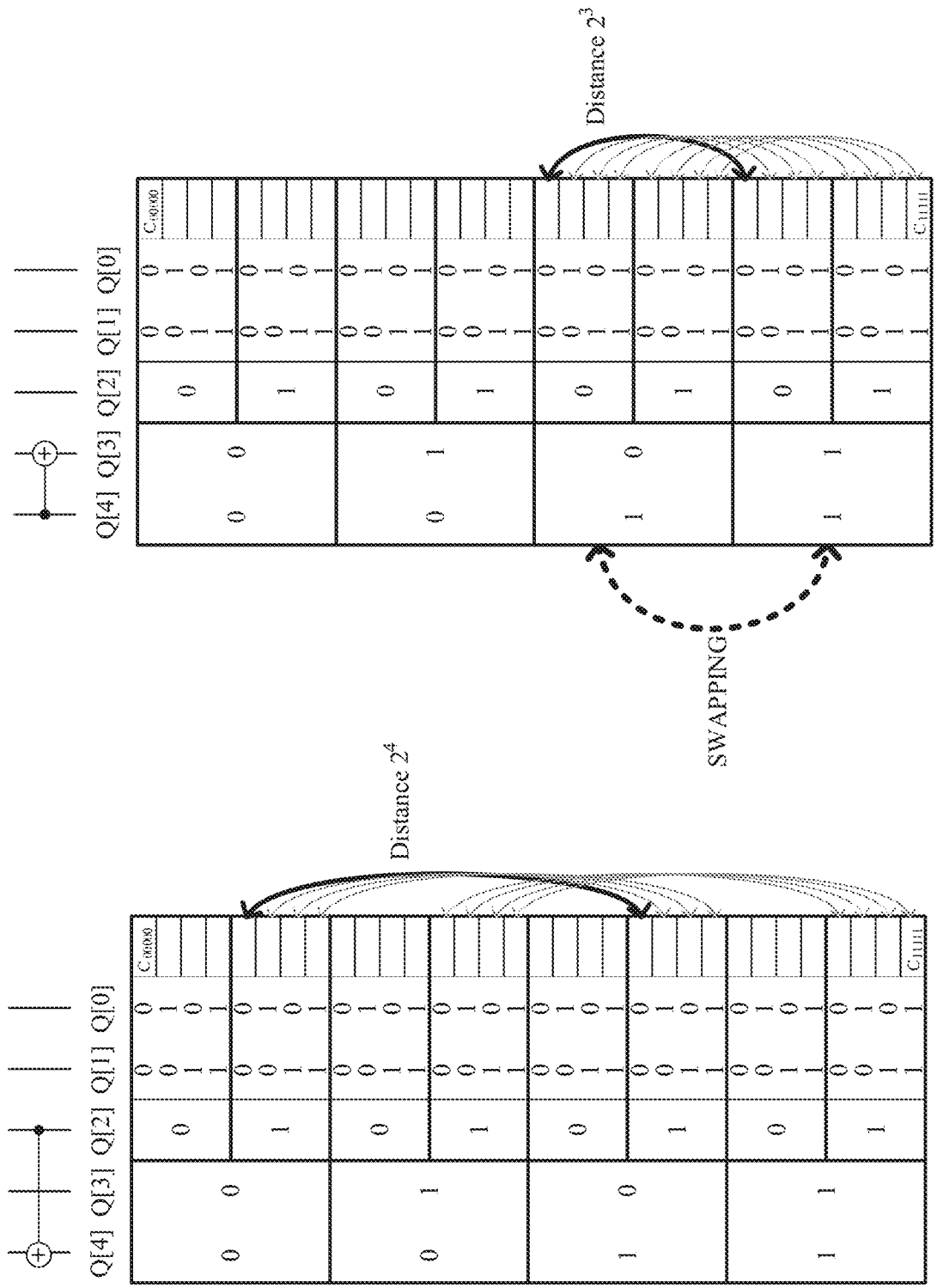

AVOIDING DATA EXCHANGE IN GATE OPERATION FOR QUANTUM COMPUTING GATES ON A CHIP

BACKGROUND

Technical Field

The present disclosure, generally, relates to simulation technology for quantum computing, more particularly, to techniques for simulating a gate operation of quantum computing.

Description of the Related Art

Since the large number of qubits to be simulated needs huge memory, parallelization of quantum computing simulation is demanded. For example, when double precision complex number is used for each quantum amplitude, available memory size of $16*2^{qubits}$ bytes is needed. Also computational capability of the accelerators (e.g., GPU, FPGA) contributes to accelerate the simulation of the quantum computing. However, data communication/movement overheads degrade the performance of the simulations.

Therefore, there is a need for developing novel technology capable of simulating a gate operation of quantum computing over one or more computing nodes in an efficient manner.

SUMMARY

According to an embodiment of the present invention, a computer-implemented method performed by one or more computing nodes for simulating a gate operation of quantum computing is provided. The method includes dividing a problem having $2^n$ size into a plurality of sub-problems, each of which has $2^m$ size. The method also includes preparing a first index table for storing a first identifier given for each sub-problem. The method further includes, in response to a request for a gate operation involving exchanges of quantum amplitudes designated by a target qubit at least in part, determining whether a first condition regarding at least the target qubit and m is satisfied or not. The method includes further, in response to the first condition being satisfied, swapping corresponding first identifiers in the first index table in place of the exchanges of the quantum amplitudes.

Computer systems and computer program products relating to one or more aspects of the present invention are also described and claimed herein.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings in which:

FIGS. 8A and 8B illustrate schematics of pairwise calculations with various combinations of pair distance and a control qubit during the simulation of the CNOT gate operation according to an exemplary embodiment of the present invention;

DETAILED DESCRIPTION

Hereinafter, the present invention will be described with respect to particular embodiments, but it will be understood by those skilled in the art that the embodiments described below are mentioned only by way of examples and are not intended to limit the scope of the present invention.

One or more embodiments according to the present invention are directed to computer-implemented methods, computer systems and computer program products for simulating a gate operation of quantum computing using one or more computing nodes.

Hereinafter, referring to a series of FIGS. 1-10, a computer system and methods for simulating a gate operation of quantum computing using a computer system, in which the computer system includes a plurality computing nodes with one or more accelerators, will be described. Then, referring to a series of FIGS. 11-12, a computer system and a method for simulating a gate operation of quantum computing using a computer system, in which the computer system includes a plurality computing nodes with no accelerator, will be described. Then, referring to a series of FIGS. 13-14, a computer system and a method for simulating a gate operation of quantum computing using a computer system, in which the computer system includes only one computing node with one or more accelerators, will be described.

Then, referring to FIG. 15, experimental studies on the novel quantum computing simulation according to the exemplary embodiment of the present invention will be described. Finally, referring to FIG. 16, a hardware configuration of a computer system according to one or more embodiments of the present invention will be described.

Exemplary Embodiment

Now, referring to a series of FIGS. 1-9, a quantum computing simulation system and methods for simulating a quantum system having n qubits are described.

Figure 1:
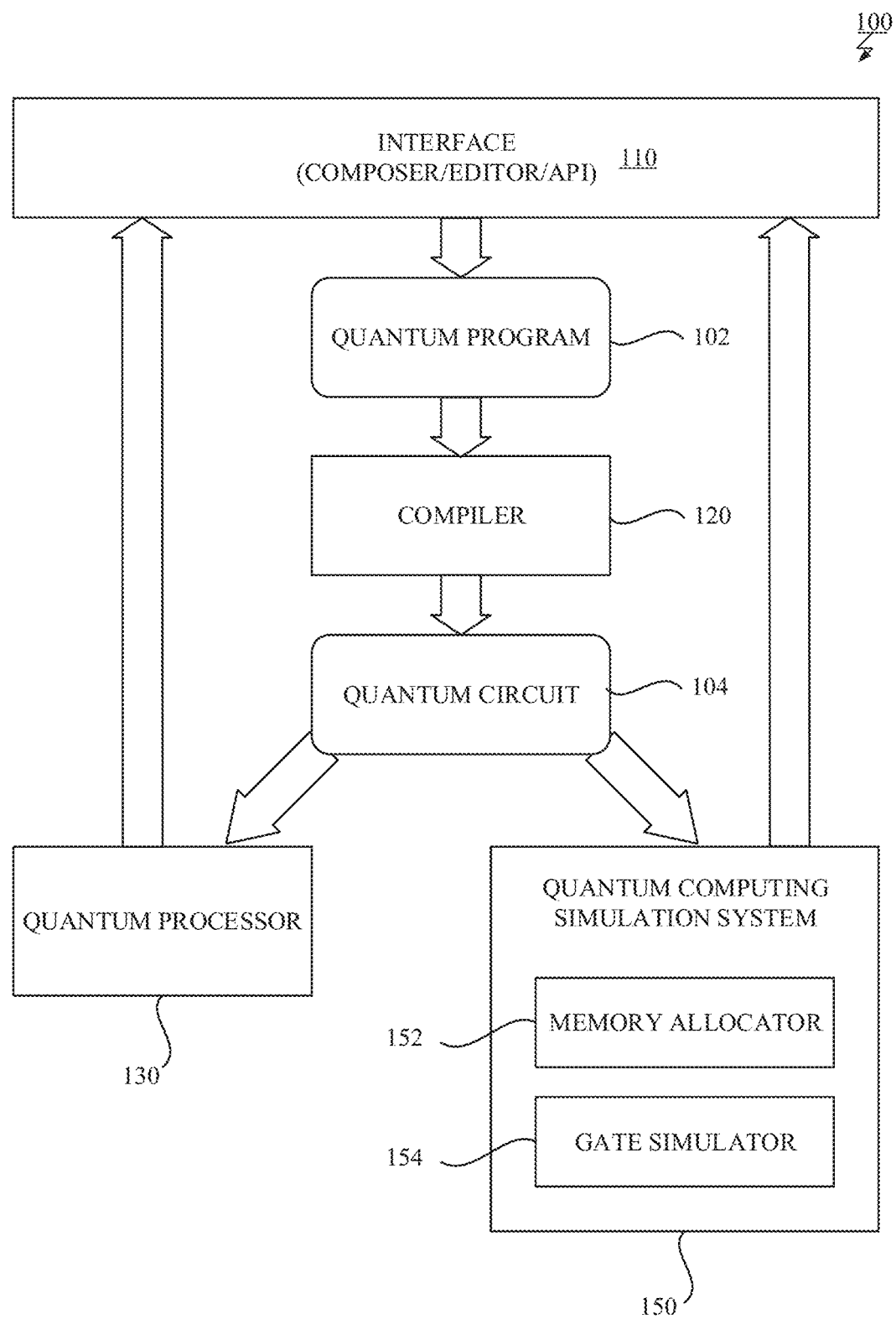
FIG. 1 illustrates a block diagram of a quantum computing environment that includes a quantum computing simulation system according to an exemplary embodiment of the present invention.

FIG. 1 illustrates a block diagram of quantum computing environment 100 (Hereinafter, simply referred as the environment 100) that includes a quantum computing simulation system 150 according to an exemplary embodiment of the present invention. In the environment 100, there are several components, including a user interface 110; a compiler 120; and a quantum processor 130, in addition to the quantum computing simulation system 150.

The user interface 110 allows users to run quantum algorithms and experiments and explore simulations in the environment 100. The user interface 110 may include a composer, an editor and APIs (Application Programming Interfaces), through which users can access the quantum computing platform. The composer is a graphical user interface to allow users to create their own quantum circuits visually. The editor is a graphical user interface to allow users to edit their own quantum program, which is an intermediate representation for quantum instructions, using a particular quantum program language. The API is designed to enable users to programmatically interact with the quantum computing hardware and simulators. The API enables users to execute a code programmed by using the particular programming language.

The quantum program 102 given from a user through the user interface 110 may be interpreted and compiled by the compiler 120 into a quantum circuit 104 in order to run efficiently on a particular configuration. The compiled version of the quantum circuit 104 is translated into a sequence of operations performed by hardware equipment to control the qubits. The output is then passed back to the user through the user interface 110. The users may get the results through the user interface 110 by either running the quantum circuit 104 on the real quantum processor 130 or by using the quantum computing simulation system 150.

The quantum processor 130 may be a real quantum processor, which is made up of a plurality of physical quantum bits (also referred to as "qubits"). A qubit is the physical carrier of quantum information and can be realized by two physical states described by quantum mechanics, which may include polarization of photons, electron spins, nuclear spins, internal states of atoms, ions or molecules, states of quantized electric circuit such as a superconducting circuit, etc. In a particular embodiment, the quantum processer 130 may be made up of a plurality of superconducting transmon qubits, which is Josephson junction based qubit and are made on silicon wafers with superconducting metals such as niobium and aluminum. In the particular embodiment, quantum gates may be performed by sending electromagnetic impulses to the qubits through coaxial cables.

The quantum computing simulation system 150 computes the quantum state expected to be produced by the given quantum circuit in a n qubit system. The quantum computing simulation system 150 includes a memory allocator 152 that allocates memory space for simulating the n qubit system over available resources; and a gate simulator 154 that simulates a quantum gate operation applied to a single or multiple qubit(s) in the n qubit system, which constitutes the given quantum circuit.

Note that a quantum circuit is a set of instructions to a quantum computer and it is a series of quantum gates targeted on different qubits along time. The quantum circuit may begin by preparing the qubits in well-defined states (e.g., the ground state), then executing a series of one- and two-qubit gates in time, followed by a measurement of the qubits.

As described above, the qubit is the physical carrier of quantum information. The quantum state of the qubit can take values of $|0\rangle$, $|1\rangle$, or the linear combination of both, which is known as superposition. The computational basis corresponds to the two levels $|0\rangle$ and $|1\rangle$, which correspond to the following vectors:

$$|0\rangle = \begin{pmatrix} 1 \\ 0 \end{pmatrix}, |1\rangle = \begin{pmatrix} 0 \\ 1 \end{pmatrix}.$$

A superposition is a weighted sum or difference of two or more states. The qubit can be in an arbitrary quantum state, denoted $|\psi\rangle$, which can be any superposition of the basis vectors, $|\psi\rangle = \alpha|0\rangle + \beta|1\rangle$. The superposition quantities $\alpha$ and $\beta$ are complex numbers; both obey $|\alpha|^2 + |\beta|^2 = 1$. If a qubit in some state $|\psi\rangle$ is measured in the computational basis, the result 0 is obtained with probability $|\alpha|^2$, and the result 1 is obtained with the complementary probability $|\beta|^2$.

A quantum gate is an operation applied to a qubit to change its state. A single-qubit quantum gate can be represented by a 2×2 unitary matrix U. Since the quantum gates are needed to be reversible and preserve probability amplitudes, the matrices are unitary. The quantum state $|\psi'\rangle$ after the action of the quantum gate is found by multiplying the original quantum state by the gate, $|\psi'\rangle = U|\psi\rangle$.

There are various types of the gate operation, which may include single-qubit gates: an identity gate (I); Pauli gates such as bit-flips (X), phase-flips (Z), a combined bit-flip and phase-flip (Y); Clifford gates such as Hadamard gate (H) and phase gates (S, S†) for generating quantum superpositions and complex quantum phases; non-Clifford gates such as phase gates (T, T†); and multiple-qubit gates such as two-qubit controlled NOT gate (CNOT) for generating entanglement, three-qubit controlled controlled NOT gate(CCNOT). There are more general forms of the single qubit gate operations, including U1, U2, U3, which take in one, two and three parameters, respectively.

A quantum measurement takes any superposition state of the qubit, and projects the state to either the state |0⟩ or the state |1⟩, with a probability determined from the superposition quantities.

The quantum computing simulation system 150 computes the quantum states of the n qubit system expected to be produced by performing a series quantum gates targeted on respective qubits that are defined in the given quantum circuit. The quantum computing simulation system 150 may be located on a cloud computing environment or a local computing environment of users.

Figure 2:
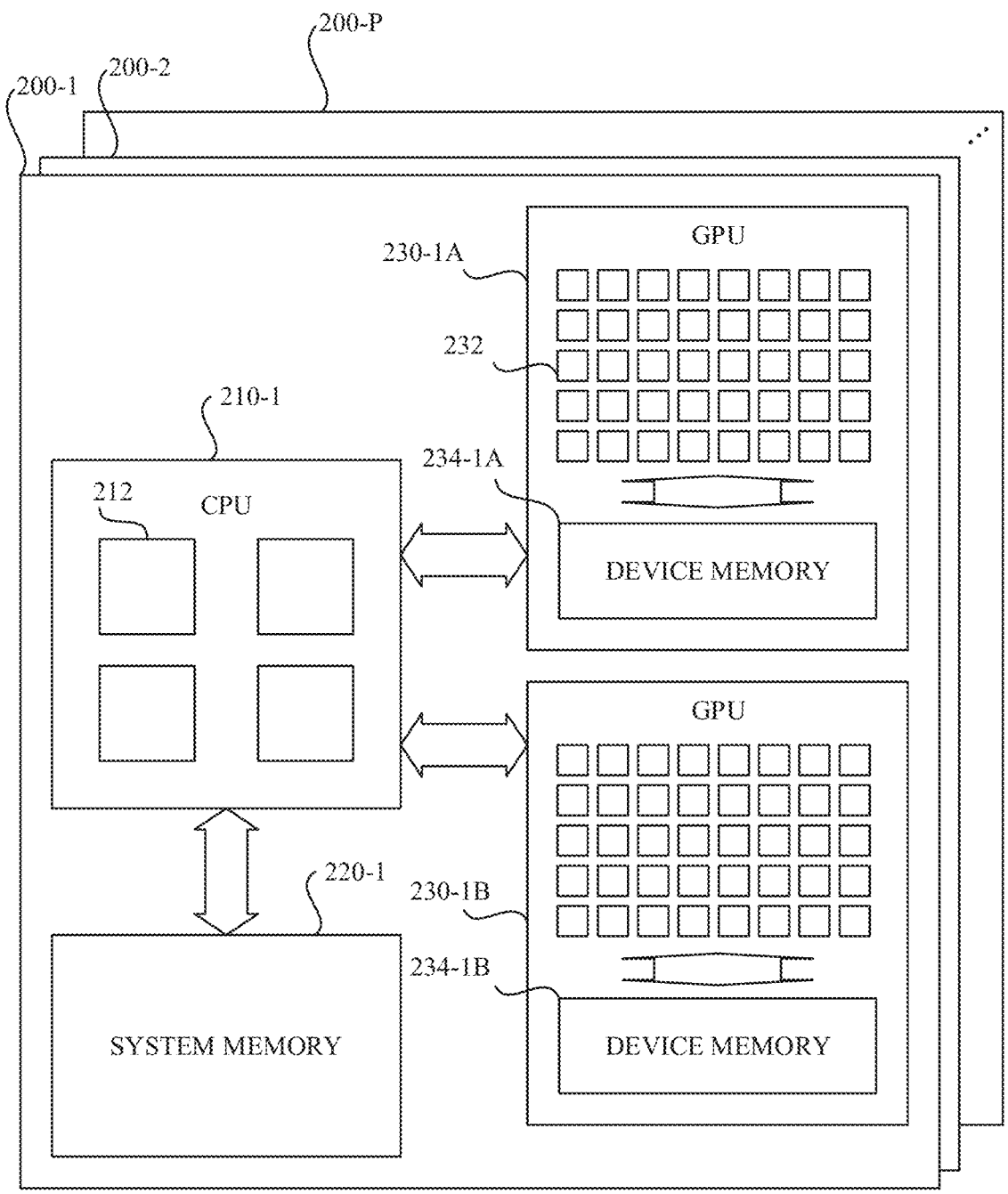
FIG. 2 depicts a schematic of a configuration of the computing environment used for simulating quantum computing according to a particular embodiment of the present invention.

With reference to FIG. 2, a schematic of configuration of computing system used for simulating the quantum computing according to a particular embodiment of the present invention is described. The quantum computing simulation system 150 shown in FIG. 1 is built on a classical ("classical" in a sense countering "quantum" computers) computer system. In FIG. 2, there is a plurality of computing nodes 200-1~200-P. Each computing node 200 includes a CPU (Central Processing Unit) 210, a system memory 220, and one or more GPUs (Graphical Processing Units) 230 as accelerators.

The CPU 210 is operably coupled to the system memory 220 through a memory bus interface. The system memory 220 may be a random access memory (RAM) and accommodate OS (Operating System) kernels, drivers and applications, as well as program instructions and data for performing the simulation of the quantum computing. The CPU 210 may have a plurality of cores 212.

The CPU 210 is also operably coupled to the GPUs 230 through a peripheral bus interface such as PCIe™ (Peripheral Component Interconnect Express), NVLink™. The GPU 230 has a plurality of cores 232, and a device memory 234 accessible by the cores 232. The device memory 234 may also be RAM and accommodate firmware as well as program instructions and data for performing calculation of the simulation of the quantum computing.

In the described embodiment shown in FIG. 2, there are two GPUs 230, 230B as hardware accelerators. However, the number of the accelerators is not limited to two. In other embodiments, there may be one accelerator or three or more accelerators in each computing node 200. Also note that in the described embodiment, GPUs are used as the accelerators. However, any hardware accelerator, which may include other specialized processors that are implemented on FPGAs (Field Programmable Gate Arrays) or ASICs (Application Specific Integrated Circuits), can be used. Also note that the number of the computing nodes is not limited. In other embodiments, there may be one or more computing nodes prepared for the quantum computing simulation system 150.

Figure 3:
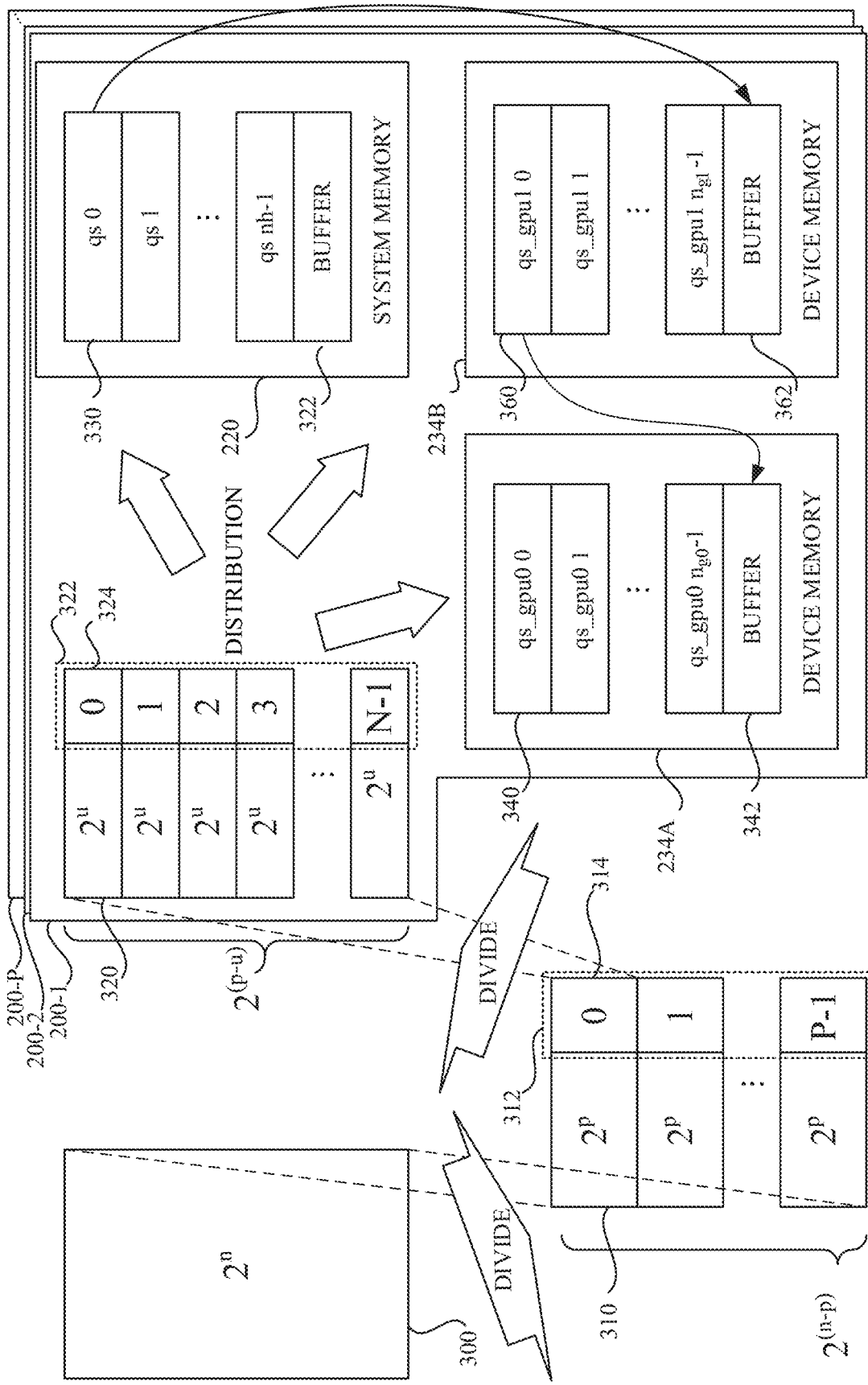
FIG. 3 illustrates a way of allocating n qubit system over a plurality of computing nodes, each of which includes system and device memories, according to an exemplary embodiment of the present invention.

Referring to FIG. 3, a way of allocating n qubit system over the plurality of the computing nodes 200, each of which includes system and device memories 220, 234, is described. As described above, the quantum system is generally made up of multiple qubits. The complex vector space of an n qubit system has a dimension equal to $2^n$. The computational basis is a set of all binary patterns for $k \in \{0, 2^n-1\}$. For example, the computational basis for two qubits is {|00⟩, |01⟩, |10⟩, |11⟩})); the basis for three qubits is {|000⟩, |001⟩, |010⟩, |011⟩, |100⟩, |101⟩, |110⟩, |111⟩}; and so on, which shows exponential increase of the number of the binary strings. In the simulation of the quantum computing, the state of the n qubit system can be represented by $2^n$ quantum amplitudes, which are complex numbers. Thus, the simulation of the n qubit quantum system is a problem with a size of n-th power of 2.

The large number of the qubit to be simulated needs huge memory size. For example, when double precision complex number is used as the quantum amplitude, available memory size of $16*2^n$ bytes (e.g., 8 TB for 39 qubits system) is needed. To prepare such huge memory size, one approach may be parallelization using a plurality of computing nodes and/or one or more accelerators. However, data communication/movement overheads between nodes, between the CPU and accelerator and/or between accelerators degrade the performance of the simulations. For example, pairwise amplitude exchanges is performed during a simulation of certain gate operations (e.g., CNOT and X gates).

In order to handle $2^n$ problem efficiently, the memory allocator 152 in the quantum computing simulation system 150 provides novel memory allocation functionality that manages the memory space of the one or more computing nodes with hierarchical index tables. The gate simulator 154 simulates a quantum gate operation applied to a single or multiple qubit(s) in the n qubit system that is managed by the memory allocator 152 while avoiding a part of data communication/movement overheads using the hierarchical index tables.

In the novel memory allocation functionality, the problem 300 having $2^n$ size (n is an integer representing the number of qubits in the quantum system) is first divided into a plurality of smaller processes 310, each of which has $2^p$ size (p is an integer given as a parameter). The number of the processes 310 obtained from the problem 300 is $2^{(n-p)}$. The parameter p may be set such that the number of the sub-problem $2^{(n-p)}$ is equal to the number of the computing nodes 200 in the computer system, P. Each process 310 having $2^p$ size is further divided into a plurality of smaller units 320, each of which has $2^u$ size (u is an integer given as a parameter). The number of the units 320 obtained from each process 410 is $2^{(p-u)}$.

The processes 310 are distributed over the plurality of the computing nodes 200-1~200-P. In each computing node 200, the units 320 are distributed over the system memory 220 and the device memory(ies) 234 (there are two device memories 234A, 234B for each computing node 200 in FIG. 3).

Each process 310 is assigned with a process identifier (ID(p)) 314 that is a unique identifier. There is a process index table 312 that holds the process identifiers 314 of all processes 310 (ID(p)=0, . . . , P–1). All processes may have copy of the process index table 312 whose content may be synchronized with each other by an appropriate mechanism. Furthermore, each unit 320 is also assigned with a unit identifier (ID(u)) 324 that is unique within one process. There is a unit index table 322 that holds the unit identifiers of all units 320 within the one process 310 (ID(u)=0, . . . , N–1). The one process may have only own unit index table 322.

The process index table 312 and the unit index tables 322 constitute hierarchical index tables. During simulation of certain types of gate operations that involve exchanges of quantum amplitudes (e.g., CNOT and X gates), exchanging of quantum amplitudes can be substituted by swapping identifiers in the hierarchical index tables under certain conditions. Such substitution is expected to alleviate data communication/movement overheads.

The hierarchical index tables may be referenced by all other gate kernels (other than this types of the gate kernels (i.e., other than CNOT and X gates). The global address of the specific unit, which is a unique identifier designating the specific unit, can be calculated from the process identifier (ID(p)) and the unit identifier (ID(u)), as follows:

Global address of the unit=ID($p$)*$2^{(p-u)}$+ID($u$).

Since a part of exchanges of the quantum amplitudes may be substituted by swapping the identifiers in the hierarchical index tables, calculations for other gate operations also need address resolution with reference to the hierarchical index tables.

When distributing the units 320 within each computing node 200, a part or whole of the units 320 may be first allocated onto the device memories 234 of the GPUs 230 within the total available memory capacity afforded by the GPUs 230. A remaining part of the units 320 ($2^{(p-u)}-\Sigma n_{gi}$; $n_{gi}$ denotes the number of the units allocated to a GPU assigned with an identifier i (i=0, . . . , # of the accelerators−1)) is allocated onto the system memory 220 if necessary. The reason for allocating the units 320 on the device memory 234 of the GPU 230 at first is because the performance of calculations by the GPU 230 is generally higher than that of the CPU 210 so that it is more efficient.

During a simulation of a gate operation applied to single qubit or multiple qubits in the n qubit system, unit-wise calculations between paired quantum amplitudes are performed by the gate simulator 154. Depending on the type of the gate operation to be simulated and/or the parameter of the gate operation such as target and/or control qubits, the calculation may be either unit-independent calculation or inter-unit calculation. The unit-independent calculation can be performed by both the CPU 210 and GPUs 230 within a single unit independently. In contrast, the inter-unit calculation needs a reference to other counterpart unit, which may be stored on the same place where one counterpart unit is stored, or a place different from the place where one counterpart unit is stored. These mutually dependent units are referred to as dependent units.

At least one temporary buffer 342/362 is prepared on each of the device memories 234. In the described embodiment, at least one temporary buffer 332 is prepared further on the system memory 220. The temporary buffers 332, 342, 362 may have the same size as the unit $2^u$ (actually $2^u \times 2^e$ bytes, e is an integer representing a size per element). The temporary buffers 332, 342, 362 can be used for storing a copy of the dependent unit that is stored on a different place, during the inter-unit calculation. As illustratively shown by curved arrows in FIG. 3, the temporary buffer 342 on the device memory 234A can be used for storing a copy of a dependent unit 360 stored on other device memory 234B. The temporary buffer 362 on the device memory 234B can be used for storing a copy of a dependent unit 330 stored on the system memory 220.

During the inter-unit calculation, if a unit stored on the system memory 220 has a dependency with a unit stored on the device memory 234A/234B within the same computing node 200, the unit stored on the system memory 220 is copied to the temporary buffer 342/362 on the device memory 234A/234B. By performing calculations, the content of the copy of one counterpart unit stored on the temporary buffer 342/362 of the device memory 234A/234B and the content of other counterpart unit originally stored on the device memory 234A/234B would be updated. In response to the copy stored on the temporary buffer 342/362 being updated, an updated version of the copy is copied back to the system memory 220 where the original of the copy is placed, by way of the data movement. On the other hand, when all the dependent units are stored on the same place, the inter-unit calculation can be done without data copy.

Inter-accelerator dependency is also handled in the same manner. If a unit stored on the device memory 234A of one GPU 230A has a dependency with a unit stored on the device memory 234B of other GPU 230B, the unit stored on the device memory 234A is copied to the temporary buffer 362 on the device memory 234B of the other GPU 230B. In response to the copy stored on the temporary buffer 362 being updated, an updated version of the copy is copied back to the device memory 234A where the original of the copy is placed.

Inter-node dependency may be also handled in the same manner. However, the inter-node dependency can be also handled in a different manner. In the described embodiment, if a unit stored on one memory 220/234 of one computing node has a dependency with a unit stored on other memory 220/234 of different computing node, the unit stored on the one memory of the one computing node is copied to the temporary buffer on the other memory of the other computing node each other, by way of data communication. Then, the original data stored on memory 220/234 is updated based on its content and the content of the copy stored on the temporary buffer at respective computing nodes, without data communication.

Note that the integer u is a parameter that may be depending on computer configurations, including the bandwidth of the network interface between the CPUs in different computing nodes, the bandwidth of the memory bus interface between the CPU and the system memory 220, the bandwidth of the bus interface between the CPU and GPUs, etc. The parameter u can be tuned by performing a benchmark (such as using randomized circuits, QFT (Quantum Fourier Transformation) circuits) so as to maximize the performance.

With reference to a series of FIGS. 4-10, the novel memory allocation and simulation functionality for certain types of gate operations will be further described in more detail.

Figure 4:
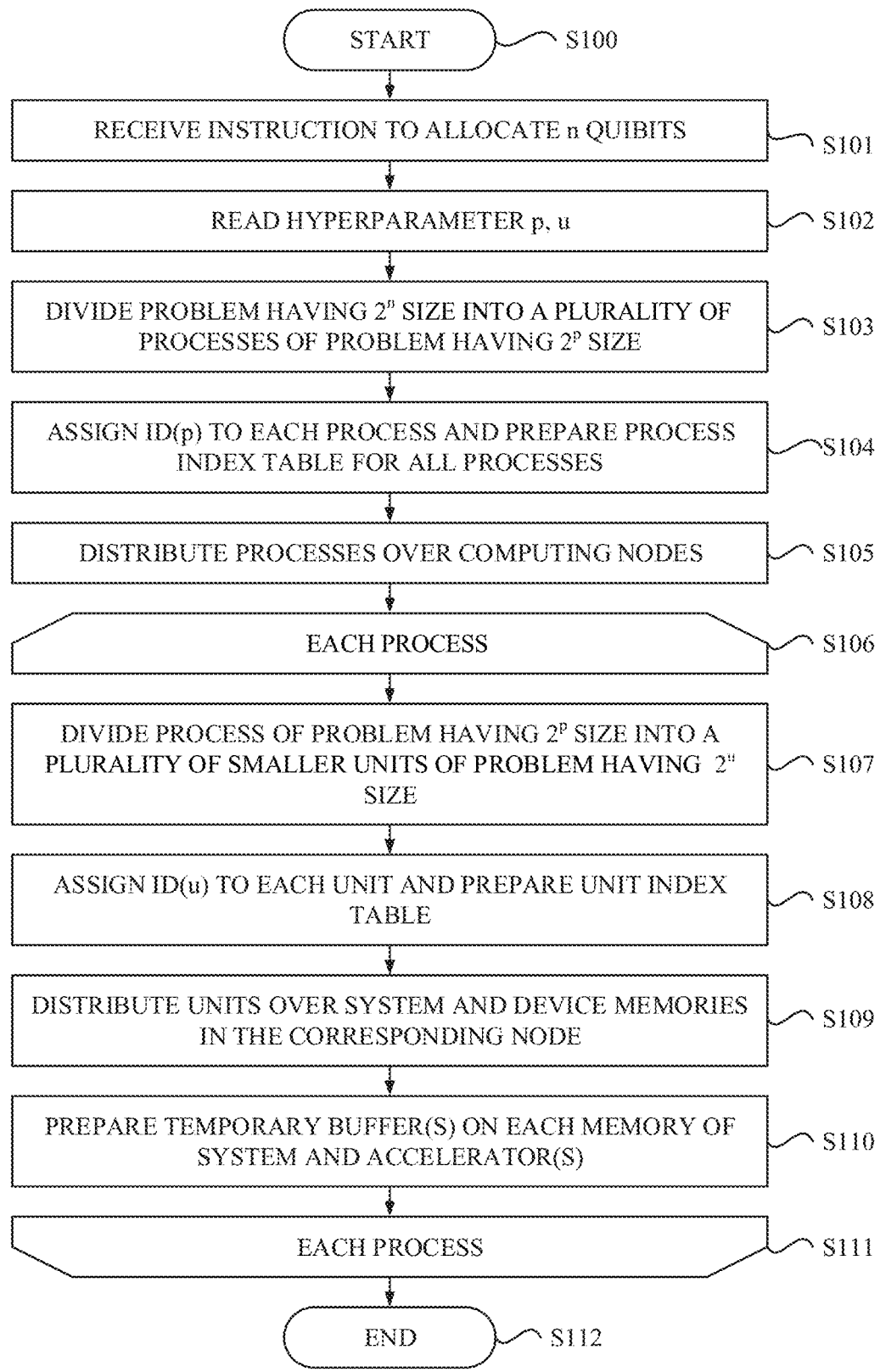
FIG. 4 is a flowchart depicting a process for allocating memory space for n qubit system over a plurality of computing nodes according to an exemplary embodiment of the present invention.

FIG. 4 is a flowchart depicting a process for allocating memory space for n qubit system over a plurality of computing nodes 200. The process shown in FIG. 4 may be performed by one CPU 210 and begin at step S101.

At step S101, the CPU 210 may read an instruction to allocate n qubits on the system. This instruction may correspond to a quantum register declaration with designation of qubits n, which may be included in a given quantum program. At step S102, the CPU 210 may read parameters of memory allocation, p and u.

At step S103, the CPU 210 may divide the problem having $2^n$ size into $2^{(n-p)}$ processes of the problem, each of which has $2^p$ size. The problem having $2^n$ size is the simulation of the n qubit quantum system and the process having $2^p$ size is a sub-problem of the simulation of the n qubit quantum system. At step S104, the CPU 210 may assign the process identifier (ID(p)) to each process and prepare the process index table 312 for all processes, which stores the process identifier (ID(p)) given for every process. At step S104, the CPU 210 may distribute the $2^{(n-p)}$ processes over the plurality of the computing nodes 200-1~200-P.

The processes from step S106 to step S111 are repeatedly performed for each process. At step S107, the CPU 210 may divide the process of the problem having $2^p$ size into $2^{(p-u)}$ smaller units of the problem, each of which has $2^u$ size. The unit having $2^u$ size is also a sub-problem of the simulation of the n qubit quantum system. At step S108, the CPU 210 may assign the unit identifier (ID(u)) to each unit and prepare the unit index table 322 for the process, which stores the unit identifier (ID(u)) given for every unit in the process. At step S109, the CPU 210 may distribute the $2^{(p-u)}$ units over the system and device memories 220, 234 in the corresponding nodes.

At step S110, the CPU 210 may prepare a temporary buffer on each of the system memory 220 and the device memory(ies) 234, which can be used for storing a copy of a dependent unit stored on a different memory, during inter-unit calculation. Then, the process may end at step S111.

Figure 5:
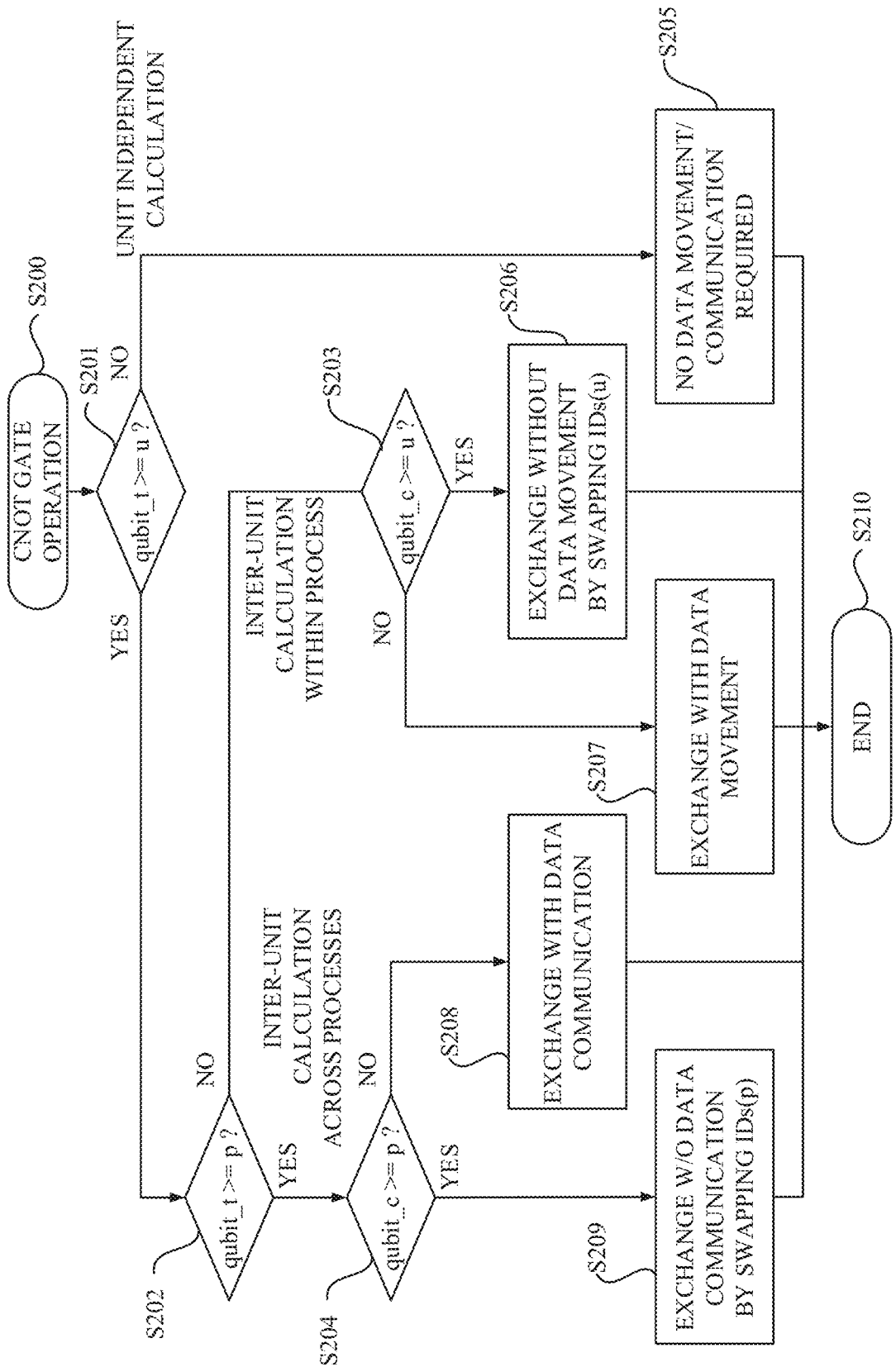
FIG. 5 is a flowchart depicting a process for performing a simulation of a CNOT gate operation on the n qubit system according to an exemplary embodiment of the present invention.

FIG. 5 is a flowchart depicting a process for performing a simulation of a CNOT gate operation on the n qubit system. The process shown in FIG. 5 may be performed by one CPU 210. The process shown in FIG. 5 may begin at step S200 in response to a request for simulating the CNOT gate operation, which may be issued after the memory allocation process shown in FIG. 4.

Figure 6A:
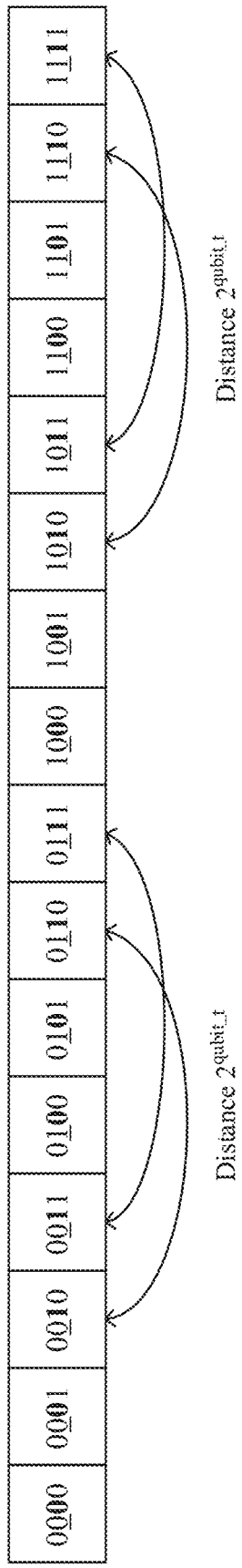
FIGS. 6A and 6B depict schematics of calculations for simulating CNOT and Pauli-X gate operations, respectively, according to an exemplary embodiment of the present invention.

FIG. 6A depicts a schematic of calculations for simulating the CNOT gate operation. The CNOT gate operation can be represented by the following equation:

$$CNOT = |0\rangle\langle 0| \otimes I + |1\rangle\langle 1| \otimes X,$$

$$= \begin{pmatrix} 1 & 0 & 0 & 0 \\ 0 & 1 & 0 & 0 \\ 0 & 0 & 0 & 1 \\ 0 & 0 & 1 & 0 \end{pmatrix}.$$

The CNOT gate is a two-qubit gate operation that has a plurality of parameters including a target qubit (qubit_t) and a control qubit (qubit_c), both of which are designated in the instruction of the CNOT gate operation. The control qubit controls whether or not the target qubit is inverted.

As illustrated in FIG. 6A, the quantum computing simulation that emulates the CNOT gate can be performed by exchanging pairwise quantum amplitudes that are designated by the target qubit (qubit_t) and the control qubit (qubit_c). The distance between the pairwise quantum amplitudes to be exchanged is determined by the target qubit (qubit_t) (distance=$2^{qubit\_t}$). Note that the distance may correspond to an address offset between paired two elements (quantum amplitudes). A determination as to whether the exchanges between pairwise quantum amplitudes are performed depends on also the control qubit (qubit_c). If its index k (binary string) have a bit "1" at the position corresponding to the control qubit (qubit_c), more specifically, a result of bitwise AND operation between the index k and $2^{qubit\_c}$ shows non-zero value (k & $2^{qubit\_c}$!=0), an exchange involving this quantum amplitude is performed.

Since the pairwise exchanges of the quantum amplitudes are defined by the distance $2^{qubit\_t}$ the target qubit (qubit_t) dominates whether calculation can be completed within one unit (i.e., unit-independent calculation) or needs references to different units (i.e., inter-unit calculation). If the inter-unit calculation is needed, further the target qubit (qubit_t) dominates whether calculation can be completed within one computing node (i.e., inter-unit calculation within the process) or needs reference to different units located at different computing nodes (i.e., inter-unit calculation across processes).

The control qubit (qubit_c) may dominate whether all the amplitudes within a predetermined range (e.g., unit or process) are targeted or not.

Referring back to FIG. 5, during the processes from step S201 to step S204, the CPU 210 may branch the process depending on several conditions regarding p, u, the target qubit (qubit_t) and the control qubit (qubit_c).

FIGS. 7A, 7B, and 7C and FIGS. 8A and 8B illustrate schematics of pairwise calculations with various combinations of pair distance and a control qubit during the simulation of the CNOT gate operation. FIGS. 7A, 7B, and 7C and FIGS. 8A and 8B show cases where a problem corresponds to a 5-qubit system (n=5), for the sake of convenience of description. The parameter p is equal to 3 and the parameter u is equal to 2.

The problem with 32 quantum amplitudes $C_k$ (k∈{k=00000, . . . , 11111}) is divided into four (=$2^{5-3}$) processes. Each process is a sub-problem holding eight (=$2^3$) quantum amplitudes $C_k$(k∈{xx000, . . . , xx111}, where xx is a first prefix of the binary strings representing the process (xx∈{00, 01, 10, 11}). Each process is further divided into two (=$2^{3-2}$) smaller units. Each unit is a sub-problem holding 4 quantum amplitudes $C_k$ (k∈{xxy00, . . . , xxy11}, where y is a second prefix of the binary strings representing the unit (y∈{0, 1}).

In FIGS. 7A, 7B, and 7C and FIGS. 8A and 8B, each process is depicted by a thick rectangle spanning five qubits and each unit is depicted by also a thick rectangle but spanning three qubits. The paired amplitudes involved in one pairwise exchange are connected by a curve with bidirected arrows.

Referring back to FIG. 5, at step S201, the CPU 210 may determine whether the target qubit is equal to or more than u or not (qubit_t>=u?). If the target qubit is determined to be not equal to or more than u in step S201 (NO), the process may branch to step S205.

On the other hand, if the target qubit is determined to be equal to or more than u in step S201 (YES), the process may branch to step S202. At step S202, the CPU 210 may determine whether the target qubit is equal to or more than p or not (qubit_t>=p?).

If the target qubit is determined to be not equal to or more than p in step S202 (NO), the process may branch to step S203. At step S203, the CPU 210 may determine whether the control qubit is equal to or more than u or not (qubit_c>=u?). If the control qubit is determined to be equal to or more than u in step S203 (YES), the process may branch to step S206. If the control qubit is determined to be not equal to or more than u in step S203 (NO), the process may branch to step S207.

On the other hand, if the target qubit is determined to be equal to or more than p in step S202 (YES), the process may branch to step S204. At step S204, the CPU 210 may determine whether the control qubit is equal to or more than p or not (qubit_c>=p?). If the control qubit is determined to be not equal to or more than p in step S204 (NO), the process may branch to step S208. If the control qubit is determined to be equal to or more than p in step S204 (YES), the process may branch to step S209.

Figure 7C:
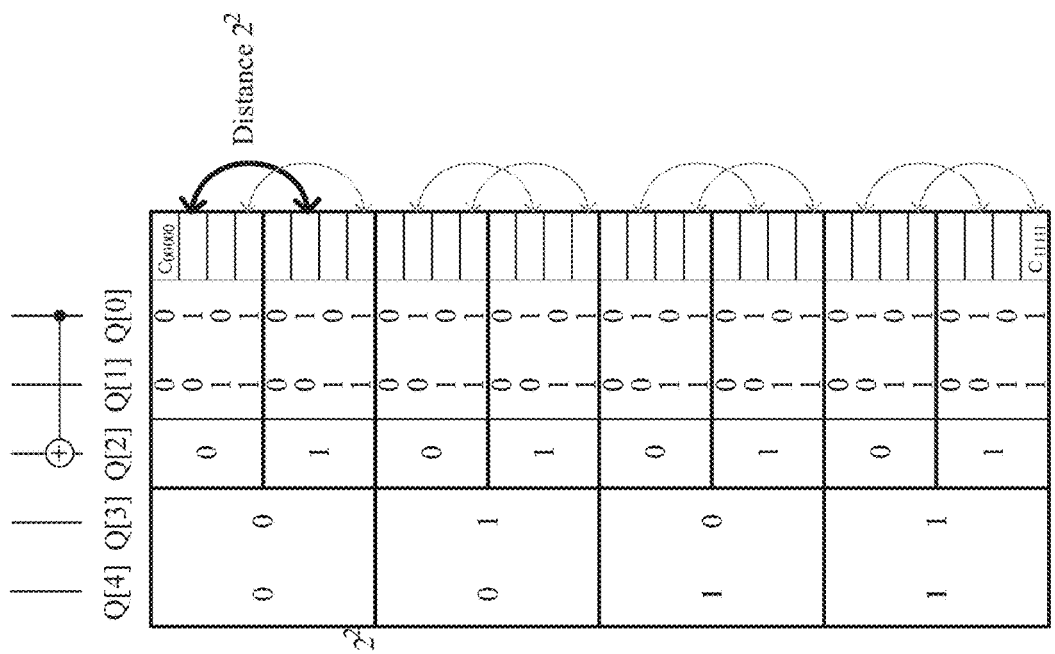
FIGS. 7A, 7B, and 7C illustrate schematics of pairwise calculations with various combinations of pair distance and a control qubit during the simulation of the CNOT gate operation according to an exemplary embodiment of the present invention.
Figure 7B:
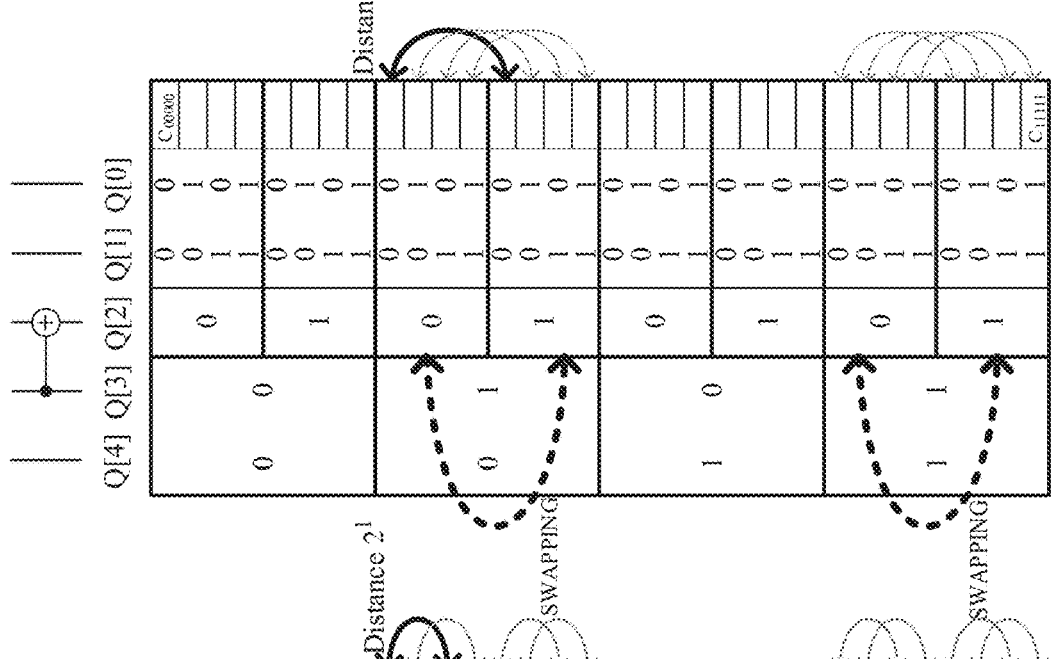
Figure 7A:
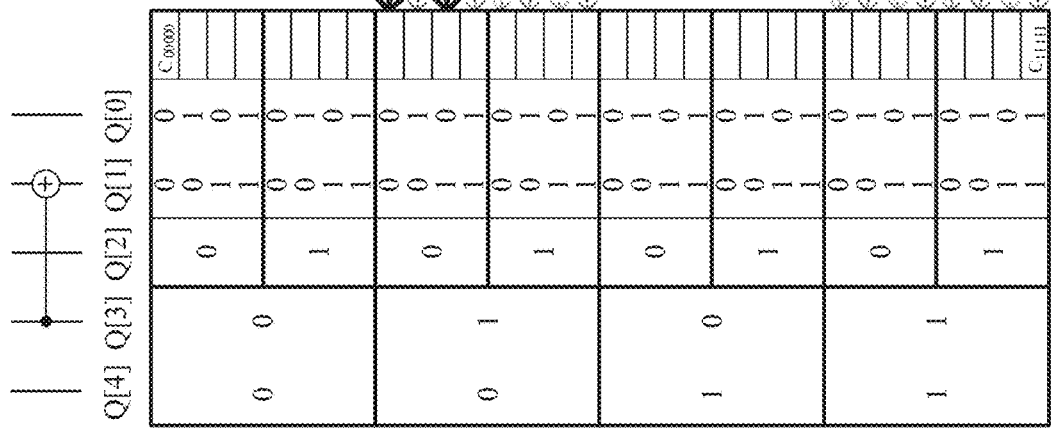

If the target qubit is less than u (qubit_t<u; NO in S201), the process may proceed to step S205. This is a case where the calculation is the unit-independent calculation. At S205, the CPU 210 may perform needed exchanges of quantum amplitudes within each unit with no data movement and communication. FIG. 7A shows a case where the target qubit is equal to 1 (<u) thus the distance of the pair is $2^1$. Note that the control qubit is equal to 3 in this example. The qubit at the solid-dot end of the CNOT gate is the control qubit that controls whether or not the target qubit at the circled-plus end of the CNOT gate is inverted. This case corresponds to a case where the unit-independent calculation can be performed since all quantum amplitudes involved in a pairwise calculation are located within a single unit. The exchanges of the quantum amplitudes can be completed within the unit without any data copy.

If the target qubit is more than or equal to u and less than p (p>qubit_t>=u; YES in S201 and NO in S202), the process may proceed to step S206 or step S207. These cases correspond to cases where the inter-unit calculation is needed but the calculation can be completed within the process since quantum amplitudes involved in a pairwise calculation span different two units but is placed within the same process.

If the control qubit is more than or equal to u (YES in S203; total condition (p, u, qubit_t, qubit_c): p>qubit_t>=u and qubit_c>=u), the process may proceed to step S206. This is a case where all quantum amplitudes in one counterpart unit and all quantum amplitudes in other counterpart unit in the same process are needed to be exchanged so that exchanging of quantum amplitudes can be substituted by swapping of identifiers in the hierarchical index tables. At S206, the CPU 210 may perform needed exchanges of quantum amplitudes within each process without data movement by swapping the unit identifiers (IDs(u)) in the unit index table 322. The swapping of the unit identifiers (IDs(u)) is done in place of the substantive exchange of the quantum amplitudes. FIG. 7B shows a case where the target qubit is equal to 2 (>=u and <p) thus the distance of the pair is $2^2$ and the control qubit is equal to 3 (>=u).

If the control qubit is less than u (qubit_c<u; NO in S203), the process may proceed to step S207. This is a case where the targets of the calculations are sparsely dispersed. At S207, the CPU 210 may perform needed exchanges of quantum amplitudes within each process with data movement if necessary. The temporary buffer may be utilized for data movement in the process. Of course, when all the dependent units are stored on the same place, the inter-unit calculation can be done without data movement. FIG. 7C shows a case where the target qubit is equal to 2 (>=u and <p) thus the distance of the pair is $2^2$ but the control qubit is equal to 0 (<u). In this case, exchanges of quantum amplitudes across different units are needed and cannot be substituted by swapping the identifiers in the hierarchal index tables.

If the target qubit is more than or equal to p (qubit_t>=p; YES in S201 and YES in S202), the process may proceed to step S208 or step S209. These cases correspond to cases where the inter-unit calculation is needed and the calculation further needs reference to units that are located different process.

If the control qubit is less than p (qubit_c<p; NO in S204), the process may proceed to step S208. This is a case where the targets of the calculations are sparsely dispersed. At S208, the CPU 210 may perform needed exchanges of quantum amplitudes across different processes with data communication. The temporary buffer may be utilized for data communication between the processes. FIG. 8A shows a case where the target qubit is equal to 4 (>=p) thus the distance of the pair is $2^4$ but the control qubit is equal to 2 (<p). In this case, exchanges of quantum amplitudes across different process are needed and cannot be substituted by swapping the identifiers in the hierarchal index tables.

If the control qubit is more than or equal to p (YES in S204; total condition (p, qubit_t, qubit_c): qubit_t>=p and qubit_c>=p), the process may proceed to step S209. This is a case where all quantum amplitudes in one counterpart process (all units in the one counterpart process) and all quantum amplitudes in other counterpart process (all units in the other counterpart process) are needed to be exchanged so that exchanging of quantum amplitudes can be substituted by swapping of identifiers in the hierarchical index tables. At S209, the CPU 210 may perform needed exchanges of quantum amplitudes across different processes without data communication by swapping the process identifiers (IDs(p)) in the process index table 312. The swapping of the process identifiers (IDs(p)) is done in place of the substantive exchange of the quantum amplitudes. FIG. 8B shows a case where the target qubit is equal to 3 (>=p) thus the distance of the pair is $2^3$ and the control qubit is equal to 4 (>=p).

Referring back to FIG. 5, when the process in step S205, S206, S207, S208 or S209 is complated, then the process may end at step S210.

Note that the gate operation described with reference to the series of FIGS. 5-8 is the CNOT gate, which is one of a two qubit gate operations involving exchanges of quantum amplitudes designated by the target qubit and the control qubit during its simulation. As similar to the aforementioned exemplary gate operation, there may be other quantum gate operation where exchanging of quantum amplitudes can be substituted by swapping the identifiers in the hierarchical index tables.

Figure 9:
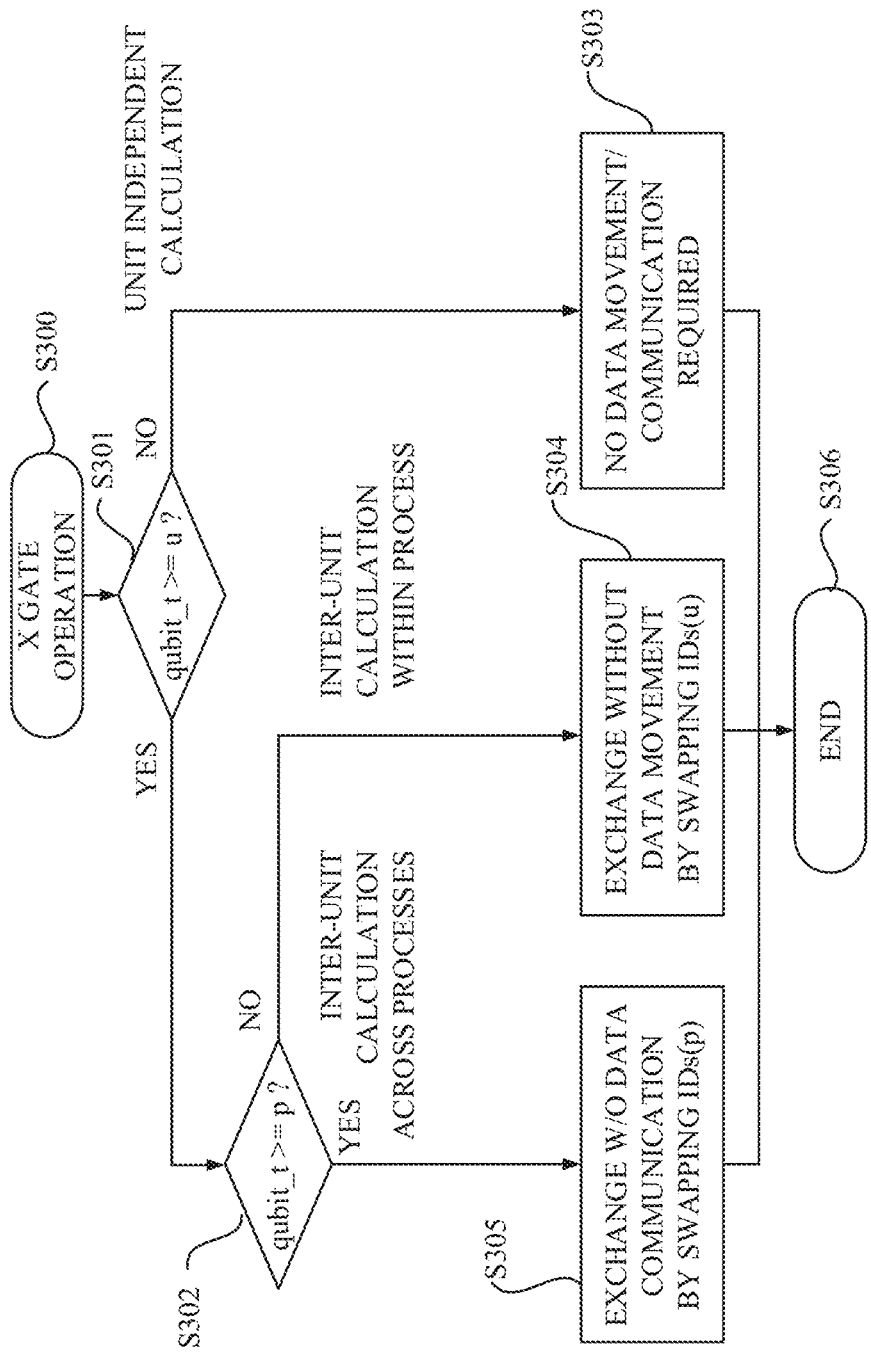
FIG. 9 is a flowchart depicting a process for performing a simulation of a Pauli-X gate operation on the n qubit system according to an exemplary embodiment of the present invention.

FIG. 9 is a flowchart depicting a process for performing a simulation of a Pauli-X gate operation on the n qubit system. The process shown in FIG. 9 may be performed by one CPU 210. The process shown in FIG. 9 may begin at step S300 in response to a request for simulating the Pauli-X gate operation, which may be issued after the memory allocation process shown in FIG. 4.

Figure 6B:
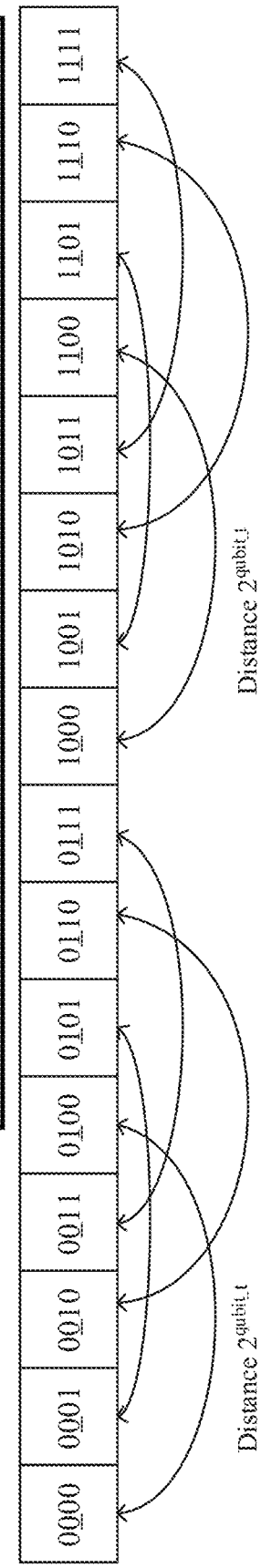

FIG. 6B depicts a schematic of calculations for simulating the Pauli-X gate operation. The Pauli-X gate operation can be represented by the following equation:

$$X = \begin{pmatrix} 0 & 1 \\ 1 & 0 \end{pmatrix}.$$

The Pauli-X gate is a single-qubit gate operation that has a parameter of a target qubit (qubit_t), which is designated in the instruction of the Pauli-X gate operation. The target qubit is inverted.

As illustrated in FIG. 6B, the quantum computing simulation that emulates the Pauli-X gate can be performed by exchanging pairwise quantum amplitudes that are designated by the target qubit (qubit_t). The distance between the pairwise quantum amplitudes to be exchanged is determined by the target qubit (qubit_t) (distance=$2^{qubit\_t}$).

Since the pairwise exchanges of the quantum amplitudes are defined by the distance $2^{qubit\_t}$, the target qubit (qubit_t) dominates whether calculation can be completed within one unit (i.e., unit-independent calculation) or needs references to different units (i.e., inter-unit calculation). If the inter-unit calculation is needed, further the target qubit (qubit_t) dominates whether calculation can be completed within one computing node (i.e., inter-unit calculation within the process) or needs references to different units located at different computing nodes (i.e., inter-unit calculation across processes) as similar to the case with CNOT gate operation.

Referring back to FIG. 9, during the processes of step S301 and step S302, the CPU 210 may branch the process depending on several conditions regarding p, u and the target qubit (qubit_t).

FIGS. 10A, 10B, and 10C illustrate schematics of pairwise calculations with various pair distances during the simulation of the Pauli-X gate operation. FIGS. 10A, 10B, and 10C show cases where a problem corresponds to a 5-qubit system (n=5), the parameter p is equal to 3 and the parameter u is equal to 2, for the sake of convenience of description.

Referring back to FIG. 9, at step S301, the CPU 210 may determine whether the target qubit is equal to or more than u or not (qubit_t>=u?). If the target qubit is determined to be not equal to or more than u in step S301 (NO), the process may branch to step S303.

This is a case where the calculation is the unit-independent calculation. At S303, the CPU 210 may perform exchanges of quantum amplitudes within the unit with no data movement and communication. FIG. 10A shows a case where the target qubit is equal to 1 (<u) thus the distance of the pair is $2^1$. In this case, exchanges of quantum amplitudes can be completed within each unit without any data copy.

On the other hand, if the target qubit is determined to be equal to or more than u in step S301 (YES), the process may branch to step S302. At step S302, the CPU 210 may further determine whether the target qubit is equal to or more than p or not (qubit_t>=p?). If the target qubit is determined to be not equal to or more than p in step S302 (NO), the process may branch to step S304. On the other hand if the target qubit is determined to be equal to or more than p in step S302 (YES), the process may branch to step S305.

If the target qubit is more than or equal to u and less than p (total condition (p, u, qubit_t): p>qubit_t>=u; YES in S301 and NO in S302), the process may proceed to step S304. This case corresponds to a case where the inter-unit calculation is needed but the calculation can be completed within the process. Since the Pauli-X gate operation needs pairwise exchange of all quantum amplitudes, this is also a case where exchanging of quantum amplitudes can be substituted by swapping of identifiers in the hierarchical index tables.

At S303, the CPU 210 may perform exchanges of quantum amplitudes without data movement by swapping the unit identifiers (IDs(u)) in the unit index table 322. FIG. 10B shows a case where the target qubit is equal to 2 (>=u and <p) thus the distance of the pair is $2^2$. The swapping of the unit identifiers (IDs(u)) is done in place of the substantive exchange of the quantum amplitudes.

If the target qubit is more than or equal to p (total condition (p, qubit_t): qubit_t>=p; YES in S301 and YES in S302), the process may proceed to step S305. This case corresponds to a case where the inter-unit calculation is needed and the calculation further needs reference to units located on the different process. However, this is also a case where exchanging of quantum amplitudes can be substituted by swapping of identifiers in the hierarchical index tables.

At S305, the CPU 210 may perform exchanges of quantum amplitudes without data communication by swapping the process identifiers (IDs(p)) in the process index table 312. FIG. 10C shows a case where the target qubit is equal to 4 (>=p) thus the distance of the pair is $2^4$. The swapping of the process identifiers (IDs(p)) is done in place of the substantive exchange of the quantum amplitudes.

Referring back to FIG. 9, when the process in step S303, S304 or S305 is complated, then the process may end at step S306.

According to the embodiments described herein above, novel technology capable of simulating a gate operation of quantum computing over a plurality of computing nodes with one or more accelerators in an efficient manner is provided.

By virtue of the novel memory allocation functionality with the hierarchical index tables and the novel simulation functionality using the hierarchical index tables, data communication and movement overheads can be preferably reduced.

In the aforementioned embodiments, the computer system includes the plurality of computing nodes with one or more accelerators. Also the memory allocation functionality utilizes hierarchical index tables, including the process index table 312 and the unit index tables 322. However, embodiments may not be limited to the specific embodiments described above. In one or more other embodiments, a plurality of computing nodes with no accelerator can be prepared for the quantum computing simulation system 150 and the memory allocation functionality utilizes only the process index table 312.

Figure 11:
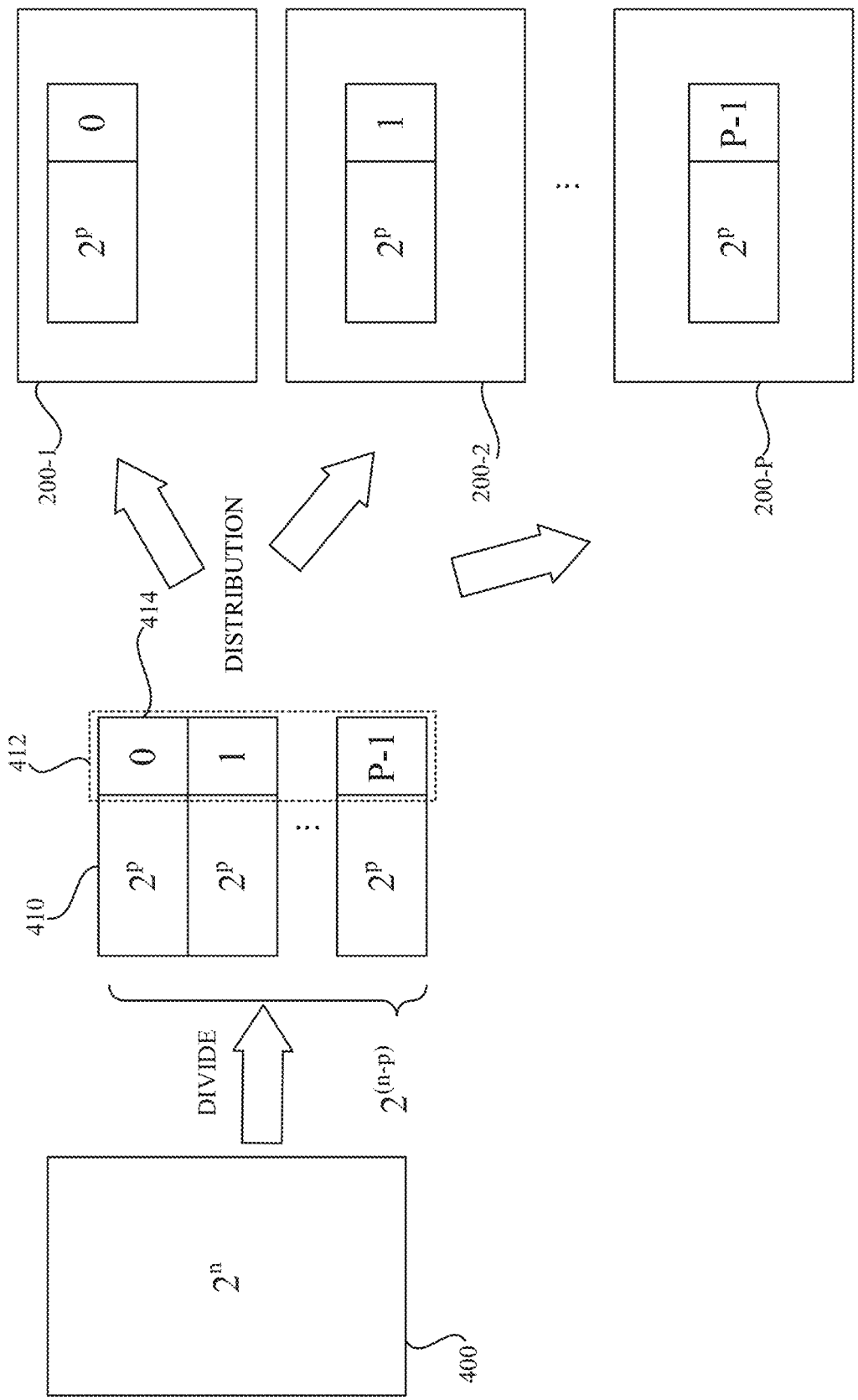
FIG. 11 illustrates a way of allocating n qubit system over a plurality of computing nodes according to an exemplary embodiment of the present invention.
Figure 12:
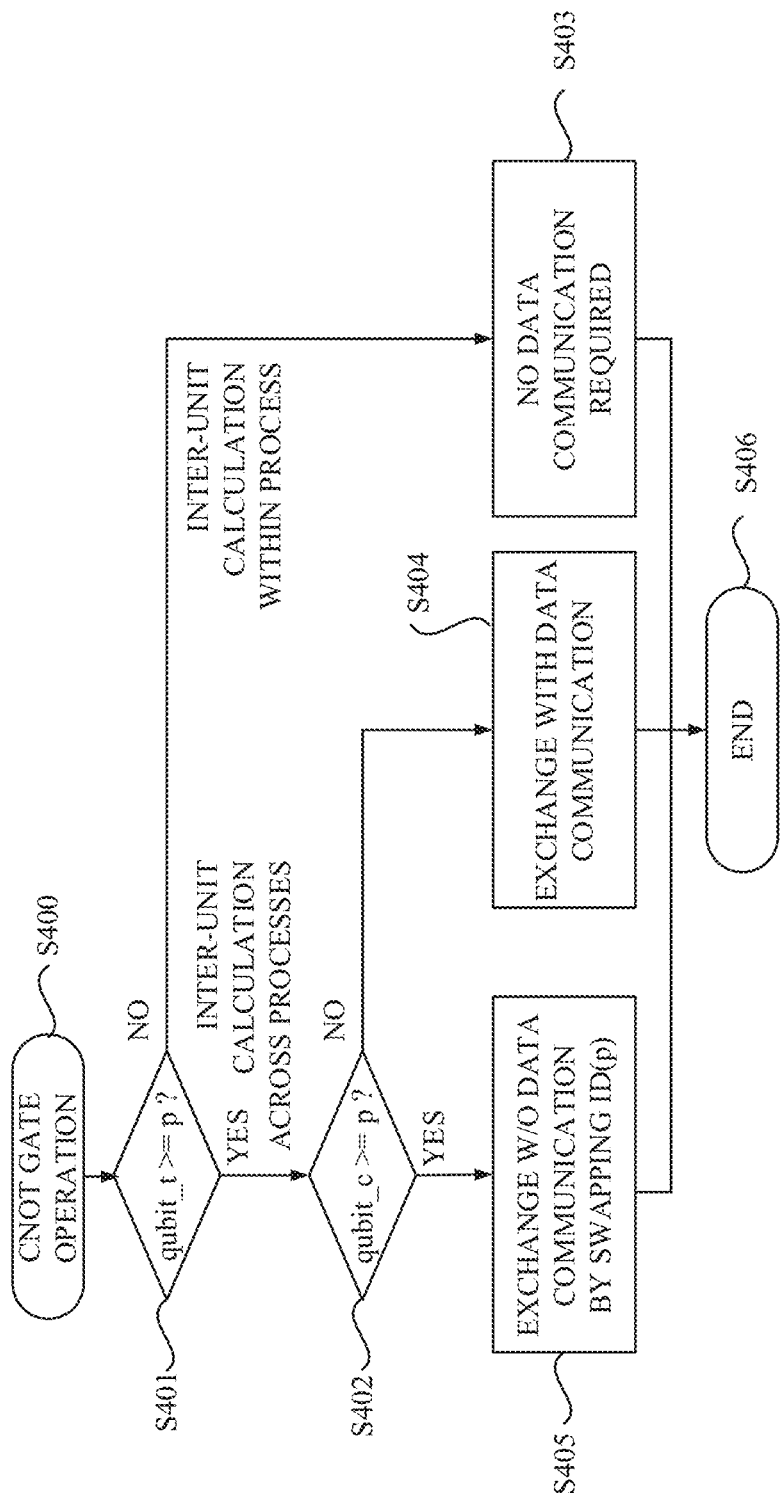
FIG. 12 is a flowchart depicting a process for performing a simulation of a CNOT gate operation on the n qubit system according to an exemplary embodiment of the present invention.

With reference to FIG. 11 and FIG. 12, an alternative embodiment is described.

Figure 10:
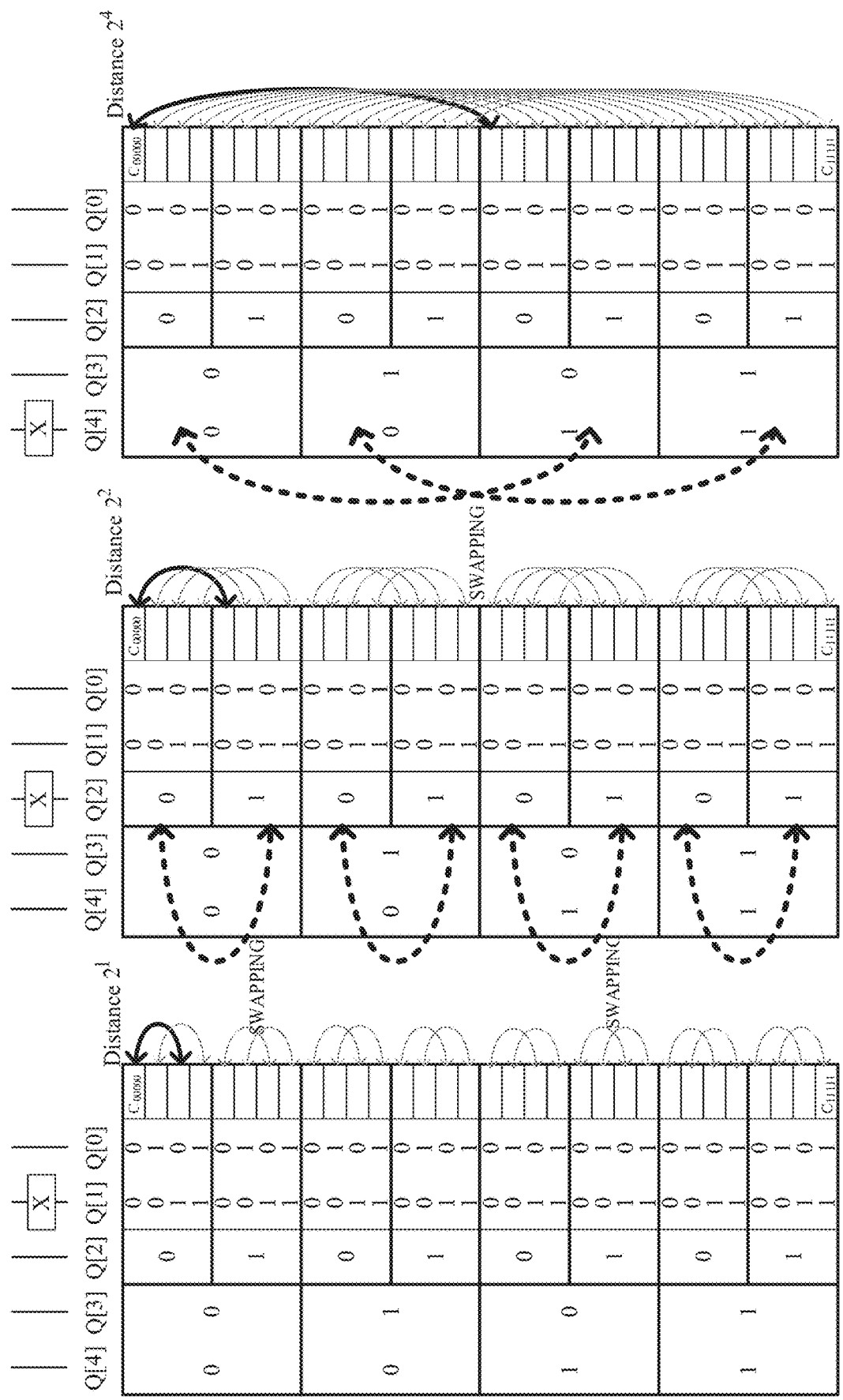
FIGS. 10A, 10B, and 10C illustrate schematics of pairwise calculations with various pair distances during the simulation of the Pauli-X gate operation according to an exemplary embodiment of the present invention.

Referring to FIG. 10, a way of allocating n qubit system over the plurality of the computing nodes 200-1~200-P according to other exemplary embodiments is described. In order to handle $2^n$ problem efficiently, the memory allocator 152, according to the other exemplary embodiment, provides novel memory allocation functionality that manages the memory space of the plurality of the computing nodes with an index table. The gate simulator 154 simulates a quantum gate operation applied to a single or multiple qubit(s) in the n qubit system that is managed by using the memory allocator 152 while avoiding data communication overheads using the index table.

The problem 400 having $2^n$ size (n is an integer representing the number of qubits in the quantum system) is first divided into a plurality of smaller processes 410, each of which has $2^p$ size (p is an integer given as a parameter). The number of the processes 410 obtained from the problem 400 is $2^{(n-p)}$. The parameter p may be set such that the number of the sub-problem $2^{(n-p)}$ is equal to the number of the computing nodes 200 in the computer system, P. The processes 710 are distributed over the plurality of the computing nodes 200-1~200-P. In a particular embodiment, each process 410 may further divided into a plurality of smaller units.

Each process 410 is assigned with a process identifier (ID(p)) 414 that is a unique identifier. There is a process index table 412 that holds the process identifiers 414 of all processes 310 (ID(p)=0, . . . , P−1). All processes have copy of the process index table 412 whose content may be synchronized with each other by an appropriate mechanism.

During simulation of certain types of gate operations that involve exchanges of quantum amplitudes (e.g., CNOT and X gates), exchanging of quantum amplitudes can be substituted by swapping of the process identifiers (IDs(p)) in the process index table 412 under certain conditions. Such substitution is expected to alleviate data communication overheads. The process index table 412 is referenced from all other gate kernels other than this type of the gate kernels. At least one temporary buffer may also be prepared on each of the computing node 200, which can be used for storing a copy of the dependent unit stored on a different place, during the inter-unit calculation. Further descriptions regarding to the memory allocation functionality according to the exemplary embodiment will be omitted.

FIG. 12 is a flowchart depicting a process for performing a simulation of a CNOT gate operation on the n qubit system according to the exemplary embodiment. The process shown in FIG. 11 may be performed by one CPU 210. The process shown in FIG. 11 may begin at step S400 in response to a request for simulating the CNOT gate operation.

At step S401, the CPU 210 may determine whether the target qubit is equal to or more than p or not (qubit_t>=p?). If the target qubit is determined to be not equal to or more than p in step S401 (NO), the process may branch to step S403. At S403, the CPU 210 may perform needed exchanges of quantum amplitudes within each unit with no data communication.

On the other hand, if the target qubit is determined to be equal to or more than p in step S401 (YES), the process may branch to step S402. At step S402, the CPU 210 may determine whether the control qubit is equal to or more than p or not (qubit_c>=p?). If the control qubit is determined to be not equal to or more than p in step S402 (NO), the process may branch to step S404. At S404, the CPU 210 may perform needed exchanges of quantum amplitudes with data communication.

On the other hand, if the control qubit is determined to be equal to or more than p in step S402 (total condition (qubit_t, qubit_c, p): qubit_t>=p and qubit_c>=p; YES in S401 and YES in S402), the process may branch to step S405. At S405, the CPU 210 may perform needed exchanges of quantum amplitudes across different processes without data communication by swapping the process identifiers (IDs(p)) in the process index table 412.

When the process in step S403, S404 or S405 is completed, then the process may end at step S406. Note that although the descriptions are omitted for a case where the gate operation is Pauli-X gate operation instead of the CNOT gate operation, it can be easily implemented by simply omitting the branching that is based on the condition regarding the control qubit (i.e., omitting the branch S402 and the process S404).

According to other exemplary embodiments, novel technology capable of simulating a gate operation of quantum computing over a plurality of computing nodes with no accelerators in an efficient manner is provided. By virtue of the novel memory allocation functionality with the process index table and the novel simulation functionality using the process index table, data communication overheads can be reduced.

Figure 13:
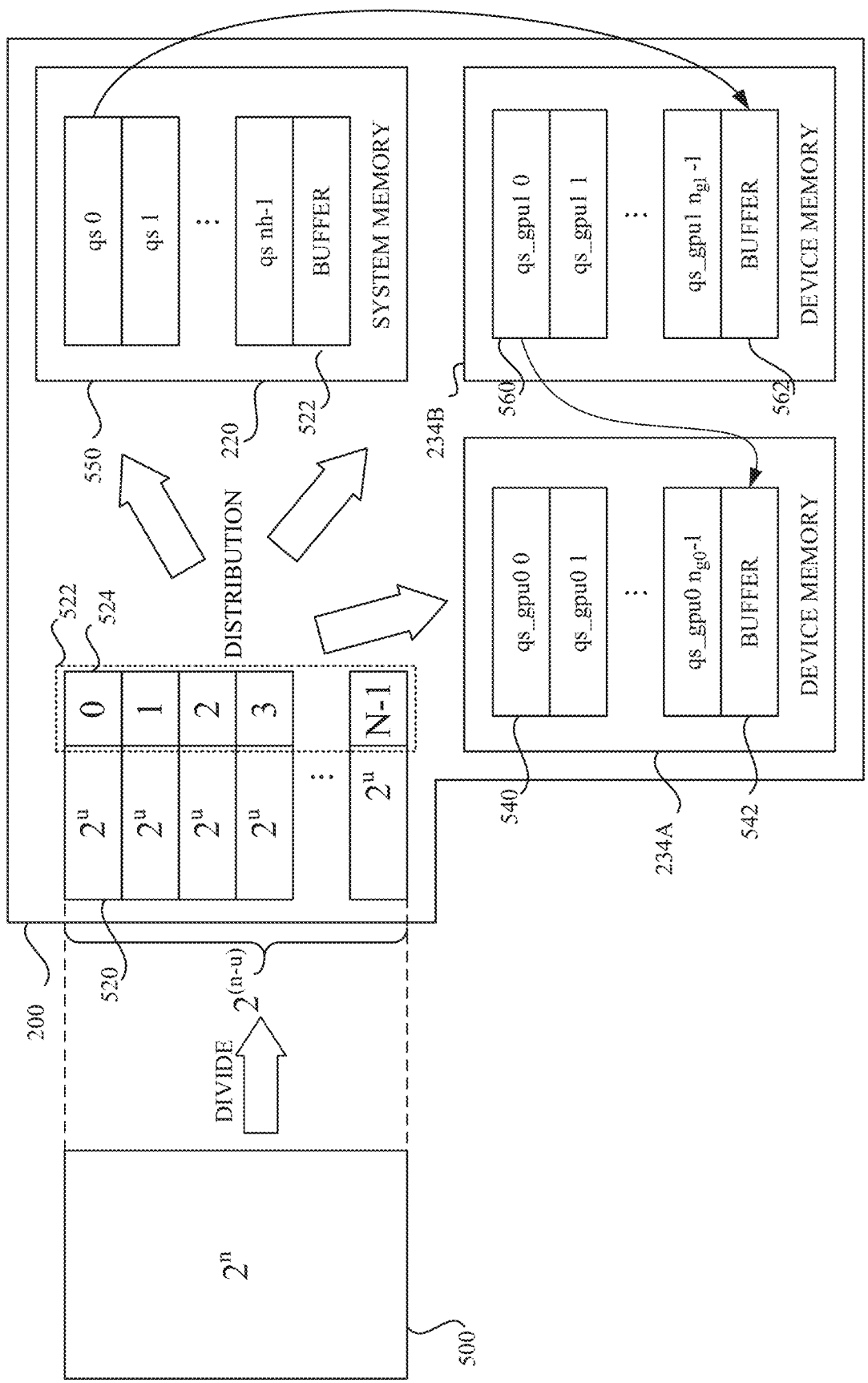
FIG. 13 illustrates a way of allocating n qubit system over system and device memories in one computing node according to an exemplary embodiment of the present invention.
Figure 14:
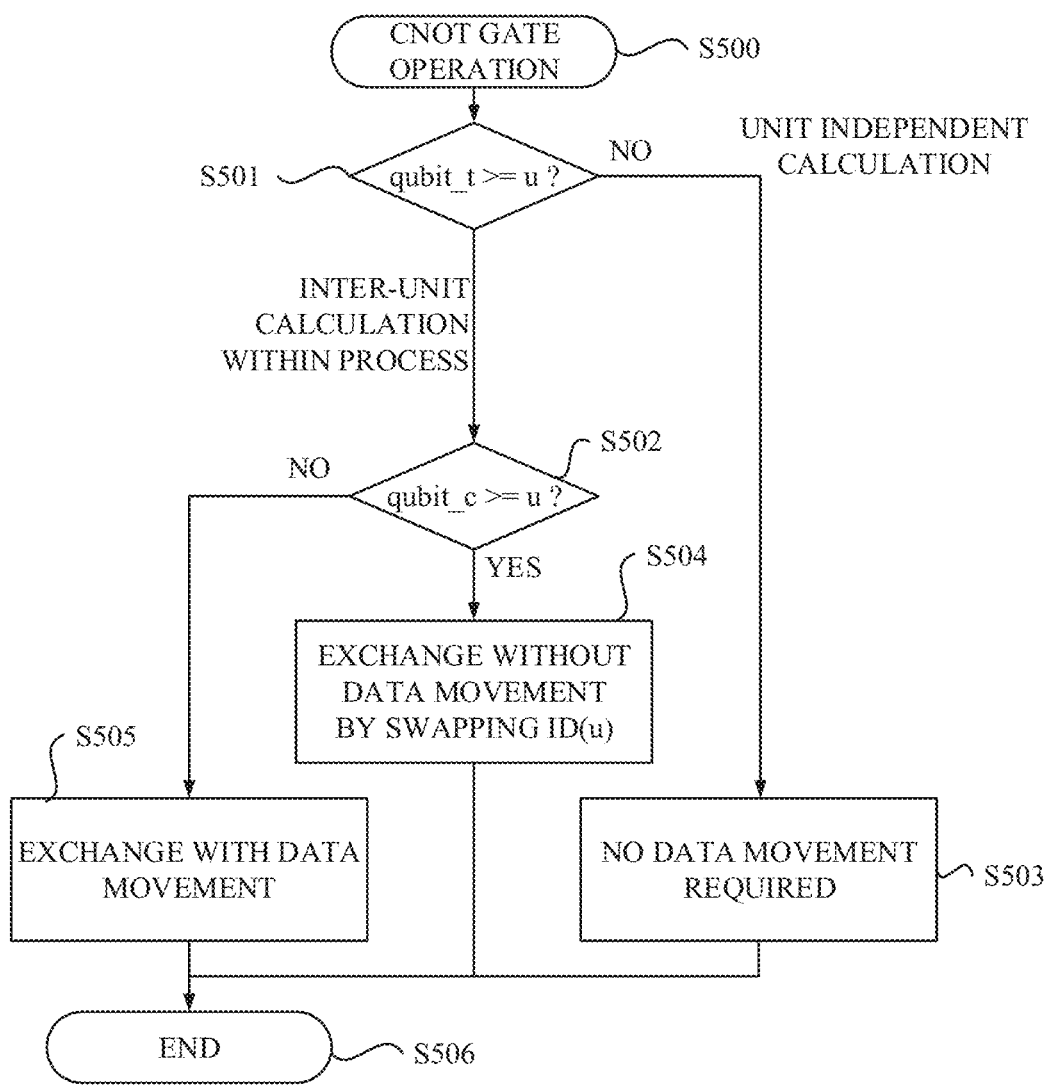
FIG. 14 is a flowchart depicting a process for performing a simulation of a CNOT gate operation on the n qubit system according to an exemplary embodiment of the present invention.

With reference to FIG. 13 and FIG. 14, another alternative embodiment is further described. In the exemplary embodiment shown in FIG. 13 and FIG. 14, the memory allocation functionality utilizes only a unit index table and a computer system including only one computing nodes with one or more accelerators is prepared for the quantum computing simulation system 150.

Referring to FIG. 13, a way of allocating n qubit system over the system and device memories 220, 234 in one computing node 200 according to the embodiment is described. In order to handle $2^n$ problem efficiently, the memory allocator 152 according to the exemplary embodiment provides novel memory allocation functionality that manages the memory space of the device memory 234 of the GPU 230 with an index table. The gate simulator 154 simulates a quantum gate operation applied to a single or multiple qubit(s) in the n qubit system that is managed by using the memory allocator 152 while avoiding data movement overheads using the index table.

The problem 500 having $2^n$ size (n is an integer representing the number of qubits in the quantum system) is divided into a plurality of smaller units 520, each of which has $2^u$ size (u is an integer given as a parameter). The number of the units 520 obtained from the problem 500 is $2^{(n-u)}$. The units 520 are distributed over the system memory 220 and the device memory(ies) 234. Each unit 520 is assigned with a unit identifier (ID(u)) 524 that is unique.

There is a unit index table 522 that holds the unit identifiers 524 of all units 520 (ID(u)=0, . . . , N−1).

During simulation of certain types of gate operations that involve exchanges of quantum amplitudes (e.g., CNOT and X gates), exchanging of quantum amplitudes can be substituted by swapping of the unit identifiers (IDs(u)) in the unit index table 522 under certain conditions. Such substitution is expected to alleviate data movement overheads. The unit index table 522 is referenced from all other gate kernels other than this type of the gate kernels. At least one temporary buffer 322, 342, 362 may also be prepared on each of the system and device memories 220, 234, which can be used for storing a copy of the dependent unit (e.g., 550, 540, 560) stored on a different place, during the inter-unit calculation, as illustratively shown by curved arrows in FIG. 13. Further descriptions regarding to the memory allocation functionality according to the exemplary embodiment will be omitted FIG. 14 is a flowchart depicting a process for performing a simulation of a CNOT gate operation on the n qubit system according to the exemplary embodiment. The process shown in FIG. 14 may be performed by the CPU 210. The process shown in FIG. 14 may begin at step S500 in response to a request for simulating the CNOT gate operation.

At step S501, the CPU 210 may determine whether the target qubit is equal to or more than u or not (qubit_t>=u?). If the target qubit is determined to be not equal to or more than u in step S501 (NO), the process may branch to step S503. At S503, the CPU 210 may perform needed exchanges of quantum amplitudes within each unit with no data movement.

On the other hand, if the target qubit is determined to be equal to or more than u in step S501 (YES), the process may branch to step S502. At step S502, the CPU 210 may determine whether the control qubit is equal to or more than u or not (qubit_c>=u?). If the control qubit is determined to be not equal to or more than u in step S502 (NO), the process may branch to step S504. At S504, the CPU 210 may perform needed exchanges of quantum amplitudes with data movement if necessary.

On the other hand, if the control qubit is determined to be equal to or more than u in step S502 (total condition (qubit_t, qubit_c, n): qubit_t>=n and qubit_c>=n; YES in S501 and YES in S502), the process may branch to step S505. At S505, the CPU 210 may perform needed exchanges of quantum amplitudes without data movement by swapping the index identifiers (IDs(u)) in the unit index table 522.

When the process in step S503, S504 or S505 is completed, then the process may end at step S506. Note that although the descriptions are omitted for a case where the gate operation is Pauli-X gate operation instead of the CNOT gate operation, it can be easily implemented by simply omitting the branching that is based on the condition regarding the control qubit (i.e., omitting the branch S502 and the process S504).

According to the embodiment, novel technology capable of simulating a gate operation of quantum computing in one computing node with one or more accelerators in an efficient manner is provided. By virtue of the novel memory allocation functionality with the unit index table and the novel simulation functionality using the unit index table, data movement overheads can be reduced.

EXPERIMENTAL STUDIES

A program implementing the module 150 shown in in FIG. 1 and the processes shown in FIG. 4 and FIG. 5 according to the exemplary embodiment was coded and executed using a benchmark quantum circuit at various conditions. The number of the qubits was varied and experiments were performed with and without the novel memory allocation and simulation functionality. The exchange avoiding (achieved by memory allocation and simulation functionality) was targeted to CNOT gate operations in the quantum circuit of the benchmark.

The benchmark was performed by using a randomized circuits. The IBM® Power® System S822LC for High Performance Computing with 512 GB system memory and four accelerators was used as one computing node. Tesla P100 GPU with 16 GB device memory was used as each accelerator.

Figure 15:
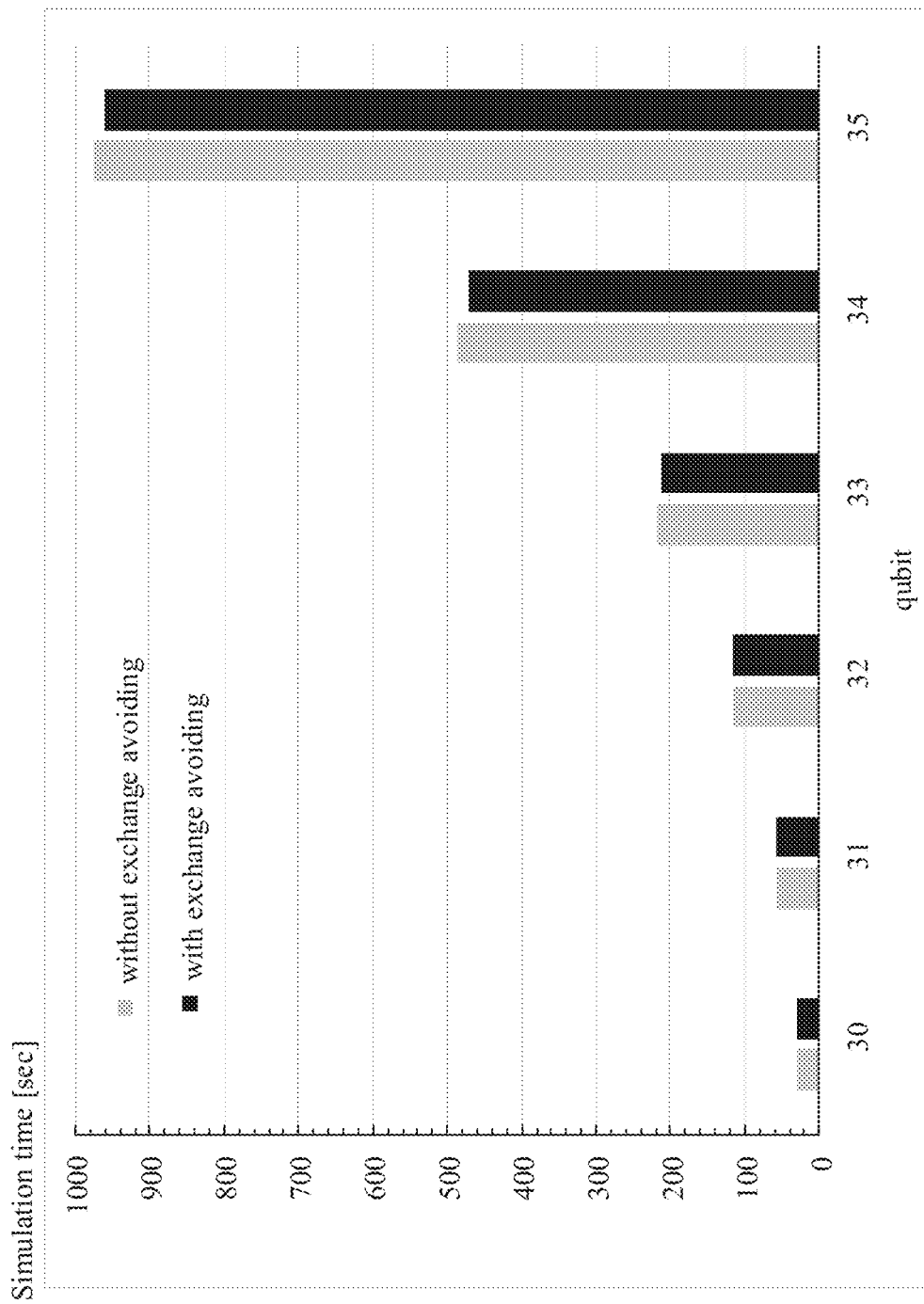
FIG. 15 depicts a graph representing a performance of quantum computing simulation against the number of the qubits in cases with and without the novel memory allocation and simulation functionality with eight nodes.

FIG. 15 depicts a graph representing a performance of quantum computing simulation in cases with and without the novel exchange avoiding functionality. The number of the qubits, n, was varied. The number of the computing node was fixed to eight. The randomized circuit was used as benchmark. The light gray bars represent simulation times that were measured in the cases without exchange avoiding functionality whereas the black bars represent simulation times that were measured in the cases with exchange avoiding functionality. As shown in FIG. 15, the simulation time for the cases with the exchange avoiding functionality outperformed the cases without the exchange avoiding functionality. It was shown that the calculation time can be shortened by using the novel exchange avoiding functionality.

Computer Hardware Component

Figure 16:
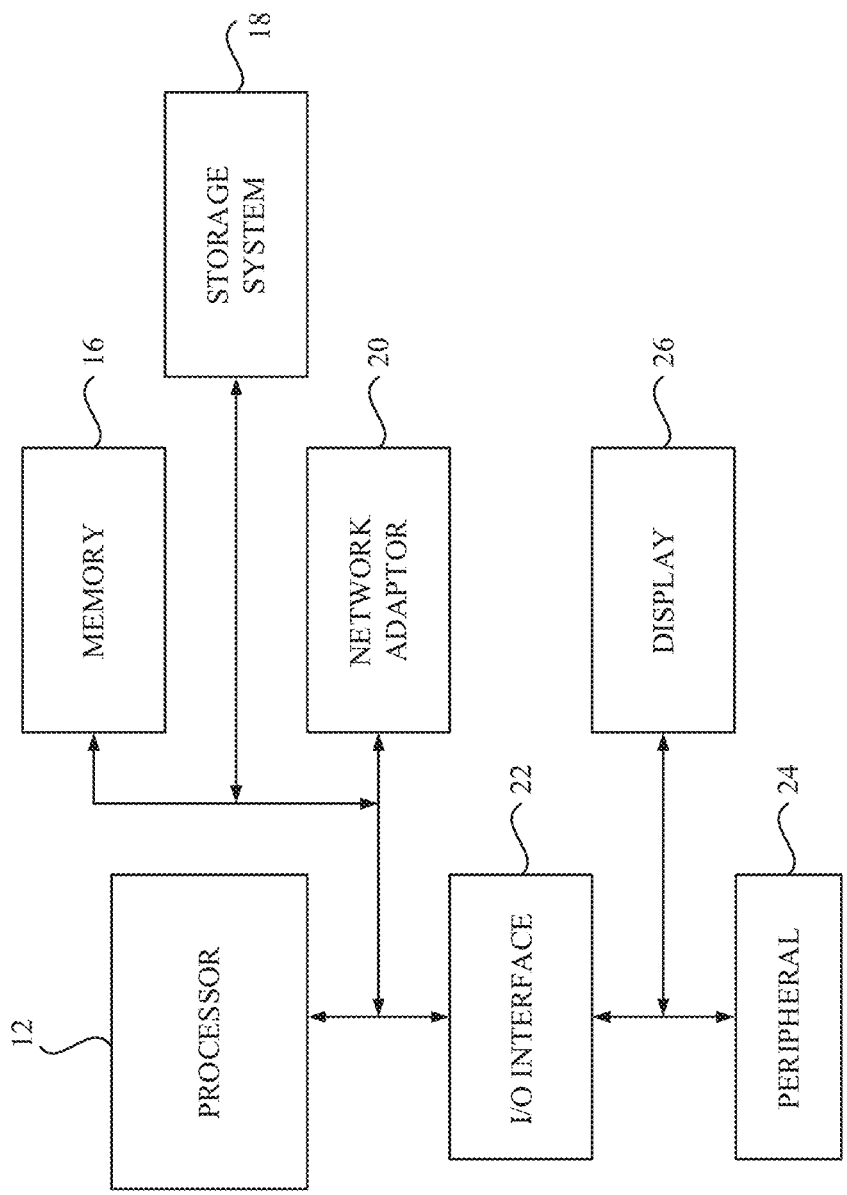
FIG. 16 depicts a computer system according to one or more embodiment of the present invention.

Referring now to FIG. 16, a schematic of an example of a computer system 10, which can be used for the quantum computing simulation system 150, is shown. The computer system 10 shown in FIG. 16 is implemented as computer system. The computer system 10 is only one example of a suitable processing device and is not intended to suggest any limitation as to the scope of use or functionality of embodiments of the invention described herein. Regardless, the computer system 10 is capable of being implemented and/or performing any of the functionality set forth hereinabove.

The computer system 10 is operational with numerous other general purpose or special purpose computing system environments or configurations. Examples of well-known computing systems, environments, and/or configurations that may be suitable for use with the computer system 10 include, but are not limited to, personal computer systems, server computer systems, thin clients, thick clients, handheld or laptop devices, in-vehicle devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system 10 may be described in the general context of computer system-executable instructions, such as program modules, being executed by a computer system. Generally, program modules may include routines, programs, objects, components, logic, data structures, and so on that perform particular tasks or implement particular abstract data types.

As shown in FIG. 16, the computer system 10 is shown in the form of a general-purpose computing device. The components of the computer system 10 may include, but are not limited to, a processor (or processing unit) 12 and a memory 16 coupled to the processor 12 by a bus including a memory bus or memory controller, and a processor or local bus using any of a variety of bus architectures.

The computer system 10 includes a variety of computer system readable media. Such media may be any available media that is accessible by the computer system 10, and it includes both volatile and non-volatile media, removable and non-removable media.

The memory 16 can include computer system readable media in the form of volatile memory, such as random access memory (RAM). The computer system 10 may further include other removable/non-removable, volatile/non-volatile computer system storage media. By way of example only, the storage system 18 can be provided for reading from and writing to a non-removable, non-volatile magnetic media. As will be further depicted and described below, the storage system 18 may include at least one program product having a set (e.g., at least one) of program modules that are configured to carry out the functions of embodiments of the invention.

Program/utility, having a set (at least one) of program modules, may be stored in the storage system 18 by way of example, and not limitation, as well as an operating system, one or more application programs, other program modules, and program data. Each of the operating system, one or more application programs, other program modules, and program data or some combination thereof, may include an implementation of a networking environment. Program modules generally carry out the functions and/or methodologies of embodiments of the invention as described herein.

The computer system 10 may also communicate with one or more peripherals 24 such as GPUs, a keyboard, a pointing device, a car navigation system, an audio system, etc.; a display 26; one or more devices that enable a user to interact with the computer system 10; and/or any devices (e.g., network card, modem, etc.) that enable the computer system 10 to communicate with one or more other computing devices. Such communication can occur via Input/Output (I/O) interfaces 22. Still yet, the computer system 10 can communicate with one or more networks such as a local area network (LAN), a general wide area network (WAN), and/or a public network (e.g., the Internet) via the network adapter 20. As depicted, the network adapter 20 communicates with the other components of the computer system 10 via bus. It should be understood that although not shown, other hardware and/or software components could be used in conjunction with the computer system 10. Examples, include, but are not limited to: microcode, device drivers, redundant processing units, external disk drive arrays, RAID systems, tape drives, and data archival storage systems, etc.

Computer Program Implementation

The present invention may be a computer system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method performed by one or more computing nodes for simulating a quantum computing system having n qubits, the method comprising:

dividing a problem that represents the quantum computing system, having $2^n$ size, into a plurality of sub-problems each having $2^m$ size;

preparing a first index table on a memory of at least the one or more computing nodes for storing a first identifier given for each sub-problem;

in response to a request for a gate operation involving exchanges of quantum amplitudes designated by a target qubit of a quantum circuit at least in part, determining that a first condition regarding at least the target qubit and m is satisfied; and in response to the first condition being satisfied, swapping corresponding first identifiers in the first index table in place of the exchanges of the quantum amplitudes.

2. The method of claim 1, wherein the number of the computing nodes is p, m is equal to p, each sub-problem is a process having $2^p$ size, the first index table is a process index table accessible by the one or more computing nodes, the first identifier is a process identifier, and the processes divided from the problem are distributed over the one or more computing nodes.

3. The method of claim 2, wherein the method further comprises:

dividing each process having $2^p$ size into a plurality of units each having $2^u$ size;

preparing, for each process, a unit index table for storing a unit identifier given for each unit;

in response to the request for the gate operation, further determining whether a second condition regarding at least the target qubit and U is satisfied or not; and in response to the second condition being satisfied, swapping corresponding unit identifiers in the unit index table in place of the exchanges of the quantum amplitudes.

4. The method of claim 3, wherein the gate operation is CNOT gate having further a designation of a control qubit, the first condition includes a sub-condition regarding the control qubit and p, and the second condition includes a sub-condition regarding the control qubit and u and a sub-condition regarding the target qubit and p.

5. The method of claim 3, wherein the gate operation is X gate and the second condition includes a sub-condition regarding the target qubit and p.

6. The method of claim 3, wherein each of the one or more computing nodes comprises processing circuitry and one or more accelerators and the method further comprises:

distributing the plurality of the units divided from one process over the processing circuitry and the one or more accelerators within a corresponding computing node to which the one process is allocated.

7. The method of claim 2, wherein the gate operation is CNOT gate having further a designation of a control qubit, and the first condition includes a sub-condition regarding the control qubit and p.

8. The method of claim 2, wherein the gate operation is X gate.

9. The method of claim 1, wherein the number of computing nodes is one, the computing node comprises processing circuitry and one or more accelerators, each sub-problem is a unit having $2^u$ size, in is equal to u, the first index table is a unit index table, the first identifier is a unit identifier, and the units divided from the problem are distributed over the processing circuitry and the one or more accelerators in the computing node.

10. The method of claim 9, wherein the gate operation is CNOT gate having further a designation of a control qubit, the first condition includes a sub-condition regarding the control qubit and u.

11. The method of claim 9, wherein the gate operation is X gate.

12. A computer system for simulating a quantum computing system having n qubits, by executing program instructions, the computer system comprising:

one or more computing nodes each comprising at least processing circuitry and a memory operably coupled to the processing circuitry, one of the memories tangibly storing the program instructions, wherein the computer system is configured to:

divide a problem that represents the quantum computing system, having $2^n$ size, into a plurality of sub-problems each having $2^m$ size;

prepare a first index table on the memory of at least the one or more computing nodes for storing a first identifier given for each sub-problem;

in response to a request for a gate operation involving exchanges of quantum amplitudes designated by a target quoit of a quantum circuit at least in part, determine that a first condition regarding at least the target qubit and m is satisfied; and in response to the first condition being satisfied, swap corresponding first identifiers in the first index table in place of the exchanges of the quantum amplitudes.

13. The computer system of claim 12, wherein the number of the computing nodes is p, m is equal to p, each sub-problem is a process having $2^p$ size, the first index table is a process index table accessible by the one or more computing nodes, the first identifier is a process identifier, and the processes divided from the problem are distributed over the one or more computing nodes.

14. The computer system of claim 13, wherein the computer system is configured to divide each process having $2^p$ size into a plurality of units each having $2^u$ size;

prepare, for each process, a unit index table for storing a unit identifier given for each unit;

in response to the request for the gate operation, further determine whether a second condition regarding at least the target qubit and u is satisfied or not; and in response to the second condition being satisfied, swap corresponding unit identifiers in the unit index table in place of the exchanges of the quantum amplitudes.

15. The computer system of claim 14, wherein the gate operation is CNOT gate having further a designation of a control qubit, the first condition includes a sub-condition regarding h control qubit and p, and the second condition includes a sub-condition regarding the control qubit and u and a sub-condition regarding the target qubit and p.

16. A computer program product for simulating a quantum computing system having n qubits, the computer program product comprising a computer readable storage medium having program instructions embodied therewith, the program instructions executable by a computer system comprising the one or more computing nodes to cause the computer system to perform a method comprising:

dividing a problem that represents the quantum computing system, having $2^n$ size, into a plurality of sub-problems each having 2m size;

preparing a first index table on a memory of at least the one or more computing nodes for storing a first identifier given for each sub-problem;

in response to a request for a gate operation involving exchanges of quantum amplitudes designated by a target qubit of a quantum circuit at least in part, determining that a first condition regarding at least the target qubit and m is satisfied; and in response to the first condition being satisfied, swapping corresponding first identifiers in the first index table in place of the exchanges of the quantum amplitudes.

17. The computer program product of claim 16, wherein the number of the computing nodes is p, m is equal to p, each sub-problem is a process having 2p size, the first index table is a process index table accessible by the one or more computing nodes, the first identifier is a process identifier, and the processes divided from the problem are distributed over the one or more computing nodes.

18. The computer program product of claim 17, wherein the method further comprises:

dividing each process having 2p size into a plurality of units each having 2u size;

preparing, for each process, a unit index table for storing a unit identifier given for each unit;

in response to the request for the gate operation, further determining whether a second condition regarding at least the target qubit and u is satisfied or not; and in response to the second condition being satisfied, swapping corresponding unit identifiers in the unit index table in place of the exchanges of the quantum amplitudes.

19. The computer program product of claim 18, wherein the gate operation is CNOT gate having further a designation of a control qubit, the first condition includes a sub-condition regarding the control qubit and p, and the second condition includes a sub-condition regarding the control qubit and u and a sub-condition regarding the target qubit and p.

* * * * *